(12) United States Patent
Guy Ritter et al.

(10) Patent No.: US 10,446,960 B2
(45) Date of Patent: Oct. 15, 2019

(54) ELECTRICAL CONNECTOR ASSEMBLY EQUIPPED WITH HEAT PIPE AND ADDITIONAL HEAT SINK

(71) Applicant: FOXCONN INTERCONNECT TECHNOLOGY LIMITED, Grand Cayman (KY)

(72) Inventors: Robert Guy Ritter, Los Altos, CA (US); Terrance F. Little, Fullerton, CA (US); Joe-Fu Chen, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/985,625

(22) Filed: May 21, 2018

(65) Prior Publication Data

US 2018/0337476 A1    Nov. 22, 2018

Related U.S. Application Data

(60) Provisional application No. 62/509,141, filed on May 21, 2017, provisional application No. 62/522,113, filed on Jun. 20, 2017.

(51) Int. Cl.
| | |
|---|---|
| *H01R 12/71* | (2011.01) |
| *H05K 7/20* | (2006.01) |
| *H01R 12/72* | (2011.01) |
| *H01R 13/6594* | (2011.01) |
| *H01R 13/6587* | (2011.01) |
| *H01R 24/60* | (2011.01) |

(52) U.S. Cl.
CPC ........ *H01R 12/721* (2013.01); *H01R 12/712* (2013.01); *H01R 13/6587* (2013.01); *H01R 13/6594* (2013.01); *H05K 7/20436* (2013.01); *H01R 24/60* (2013.01)

(58) Field of Classification Search
CPC .............. H05K 7/20436; H01R 12/721; H01R 12/712; H01R 13/6587; H01R 13/6581; H01R 13/6594
See application file for complete search history.

(56) References Cited

U.S. PATENT DOCUMENTS 9,678,546 B2 *  6/2017  May ........................ G06F 1/183
9,761,974 B2 *  9/2017  L'Esperance ........ H01R 12/721
(Continued)

*Primary Examiner* — Xuong M Chung Trans
(74) *Attorney, Agent, or Firm* — Wei Te Chung; Ming Chieh Chang

(57) ABSTRACT

An electrical connector assembly includes a metallic cage defining a receiving space therein, a receptacle connector unit received in the receiving space and including a pair of mating ports, and a number of terminal wafers stacked with one another with corresponding contacting sections exposed upon the mating ports and tail sections to be mounted on a printed circuit board on which the receptacle connector unit is mounted, and a middle heat transfer unit located between the two mating ports in a vertical direction and including a heat base linked with a pair of heat pipes on two sides, the pair of heat pipes extending through a rear of the cage and connected to a rear heat sink unit located behind the rear of the cage. Each of the pair of heat pipes is directly contacted with at least two different surfaces of the heat base.

20 Claims, 39 Drawing Sheets

(56) References Cited

U.S. PATENT DOCUMENTS

| | | | |
|---|---|---|---|
| 2003/0171033 A1* | 9/2003 | Bright | G02B 6/4201 |
| | | | 439/607.25 |
| 2015/0087180 A1* | 3/2015 | Wu | G02B 6/4269 |
| | | | 439/485 |
| 2016/0197424 A1 | 7/2016 | Molex | |
| 2017/0054234 A1 | 2/2017 | Molex | |
| 2017/0077643 A1 | 3/2017 | Samtec | |

* cited by examiner

ELECTRICAL CONNECTOR ASSEMBLY EQUIPPED WITH HEAT PIPE AND ADDITIONAL HEAT SINK

BACKGROUND OF THE INVENTION

1. Field of the Invention

The present invention relates to an electrical connector assembly, especially to the terminal layout and the terminal module assembly thereof and the so-called FP5 connector following the previous designs of which the provisional applications have Ser. No. 62/367,098 filed on Jul. 26, 2016, Ser. Nos. 62/399,272 filed on Sep. 23, 2016, 62/412,841 filed on Oct. 26, 2016, 62/425,627 filed on Nov. 23, 2016, and 62/449,133 filed on Jan. 23, 2017. The instant application claims the benefit of priority of the provisional application 62/522,113 filed on Jun. 20, 2017.

2. Description of Related Art

Currently QSFP-DD Specification Rev. 0.1 discloses a 1×1 QSFP-DD module has eight electrical lanes. Each of the eight electrical lanes of the QSFP runs at the rate of 25 Gbit/s or 50 Gbit/s, thereby the QSFP-DD module support 200 Gbit/s or 400 Gbit/s Ethernet applications of. The QSFP-DD module has an electrical receptacle. The electrical receptacle has an insulative housing and four rows of electrical terminals received in the insulative housing. Each of the electrical terminals has a soldering section. Two rows soldering sections of the two top rows of the electrical terminals are offset in a longitudinal direction from two rows soldering sections of the two bottom rows of the electrical terminals.

Even though the connector assembly is equipped with the heat sink for removing heat, anyhow a better heat transfer is desired.

SUMMARY OF THE INVENTION

An object of the present invention is to provide an electrical connector assembly equipped with the heat pipe and the additional heat sink to promote superior heat transfer performance of the whole electrical connector assembly.

To achieve the above-mentioned object, an electrical connector assembly including a metallic cage defining a receiving space therein; a receptacle connector unit received in the receiving space and including a pair of mating ports spaced apart from each other in vertical direction, and a plurality of terminal wafers stacked with one another with corresponding contacting sections exposed upon the mating ports and tail sections extending downwardly to be mounted on a printed circuit board on which the receptacle connector unit is mounted; and a middle heat transfer unit located between the two mating ports in a vertical direction and including a heat base linked with a pair of heat pipes on two sides, the pair of heat pipes extending through a rear of the cage and connected to a rear heat sink unit located behind the rear of the cage; wherein each of the pair of heat pipes is directly contacted with at least two different surfaces of the heat base.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 28:
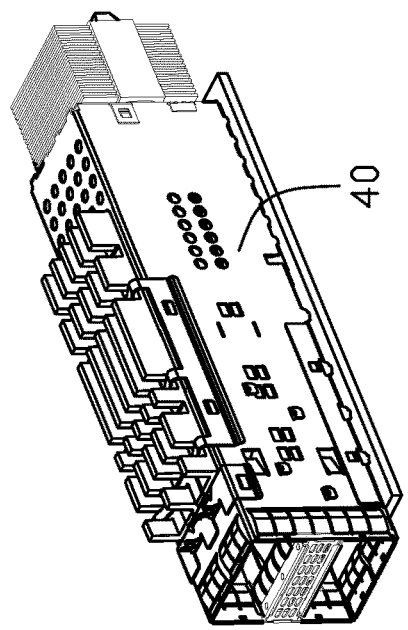
FIG. 28 is a perspective view to show the electrical connector assembly of FIG. 23 adapted to be mated with the corresponding cable/plug connectors.
Figure 28:
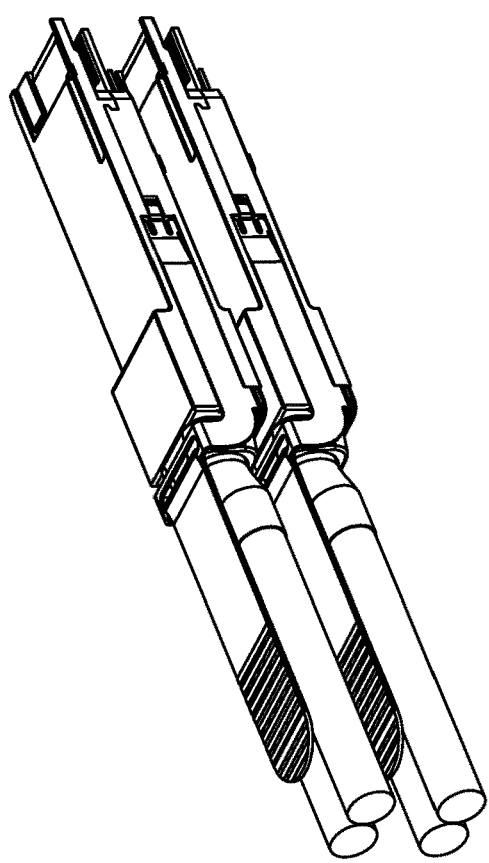
Figure 29:
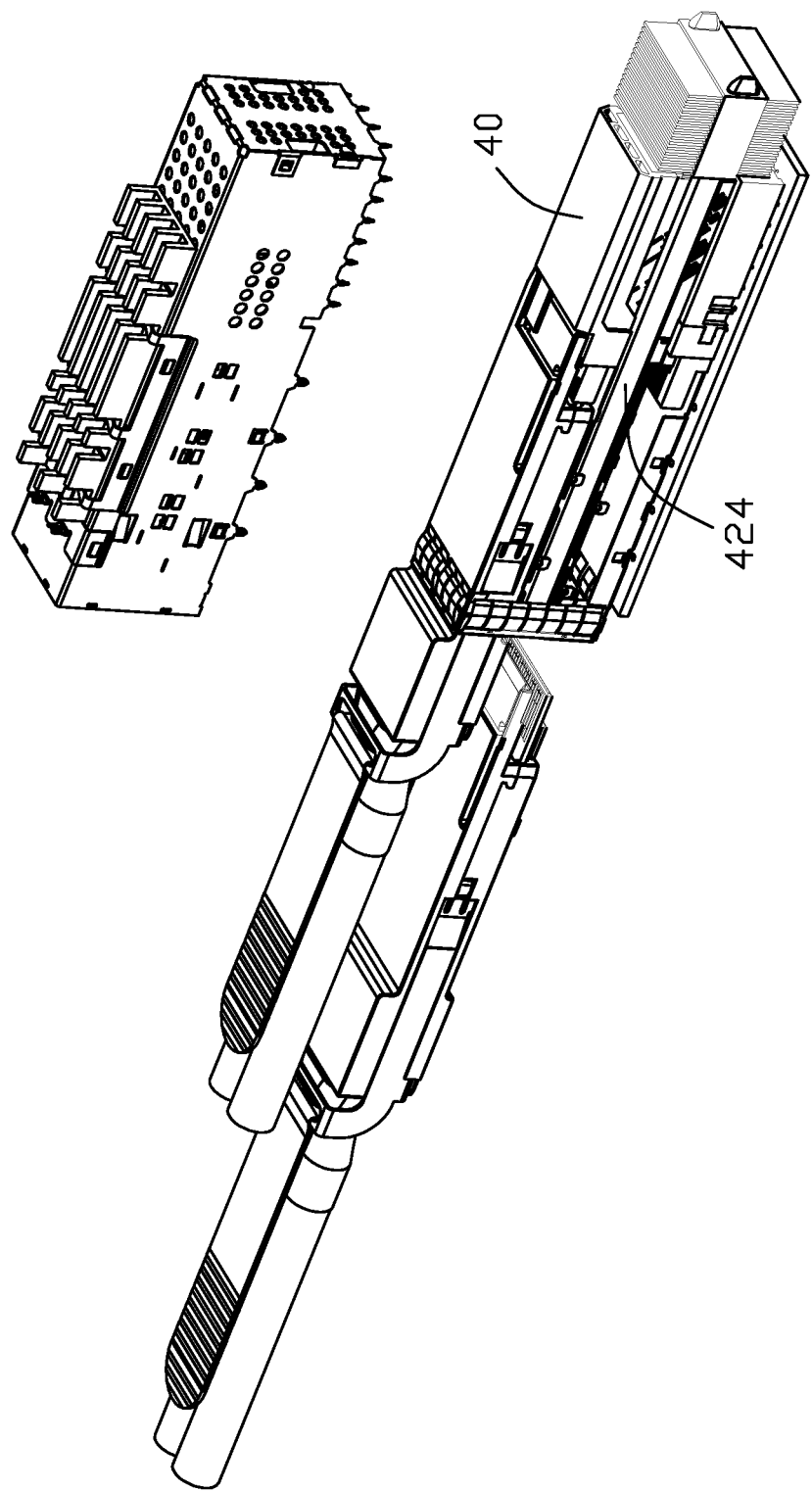
FIG. 29 is another perspective view to show one of the cable/plug connector is mated with the receptacle connector unit of the electrical connector assembly of FIG. 28.
Figure 30:
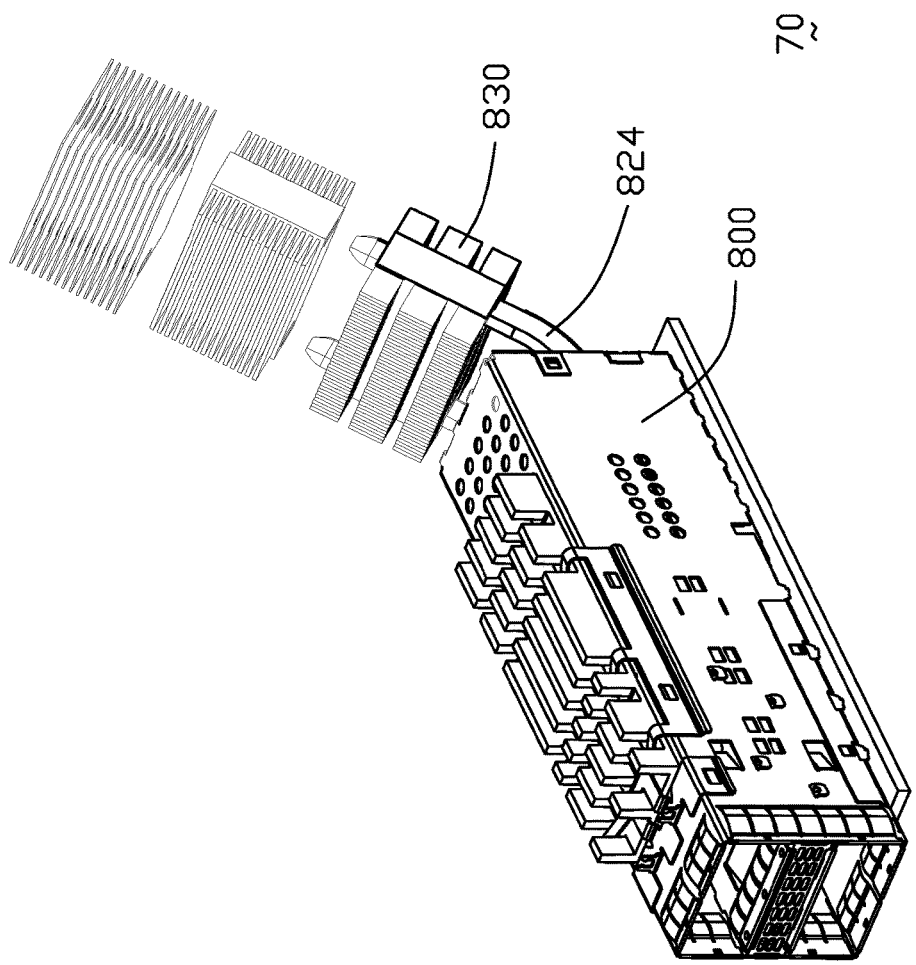
FIG. 30 is a perspective view of the electrical connector assembly according to a third embodiment of the invention.
Figure 31:
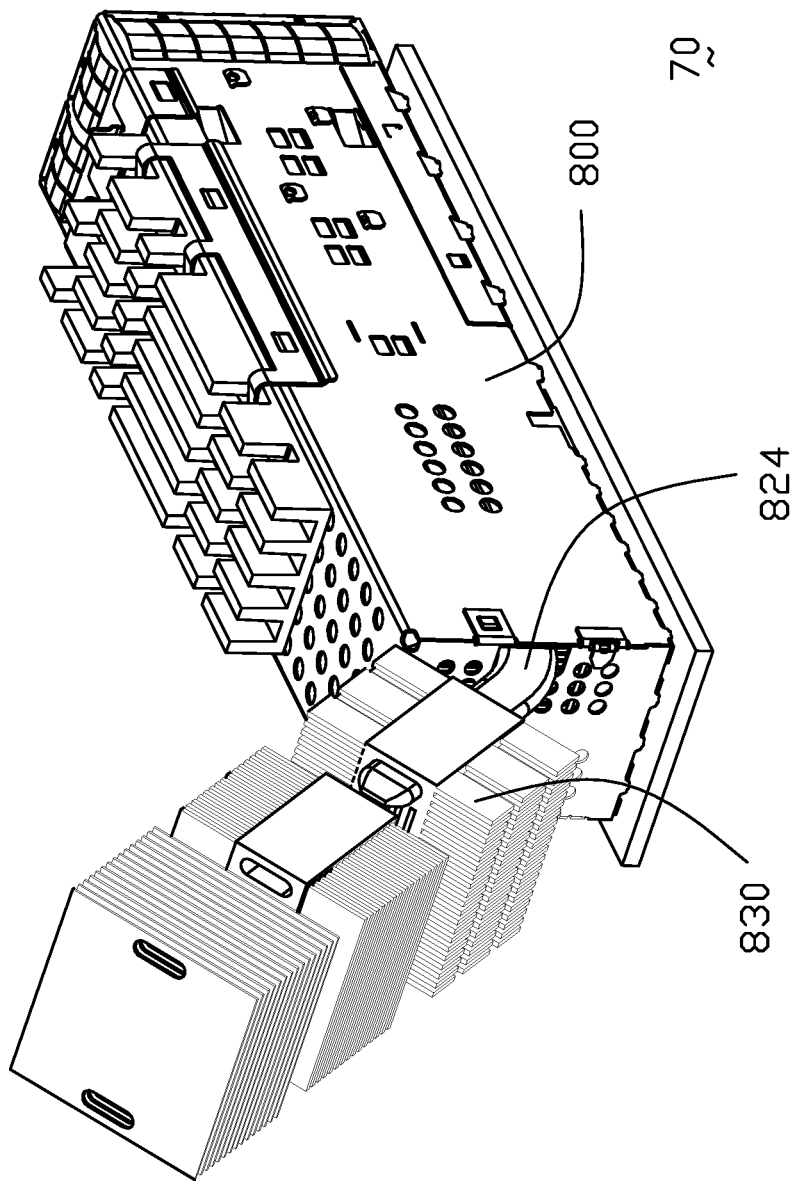
FIG. 31 is another perspective view of the electrical connector assembly of FIG. 30.
Figure 32:
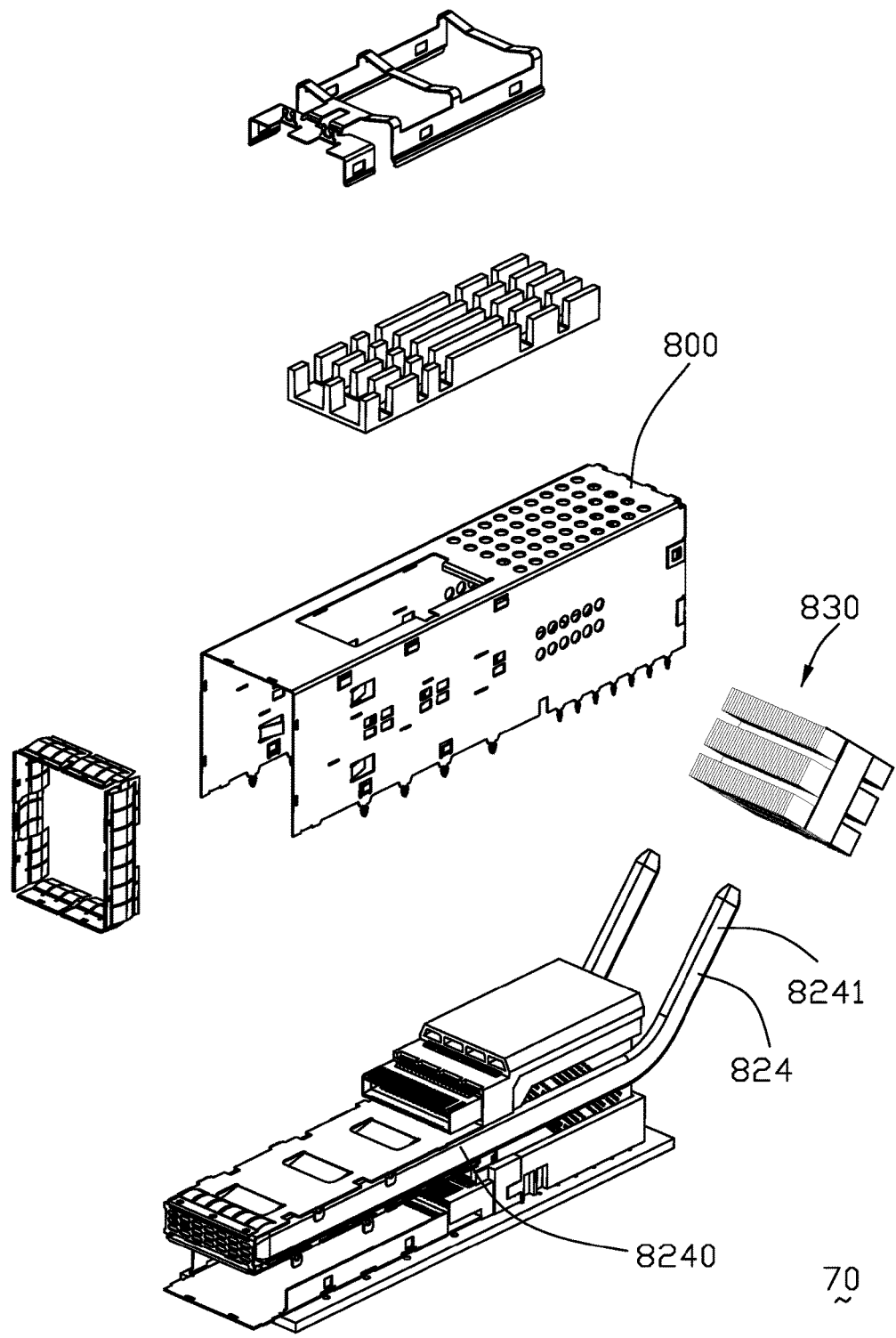
FIG. 32 is an exploded perspective view of the electrical connector assembly of FIG. 30.
Figure 33:
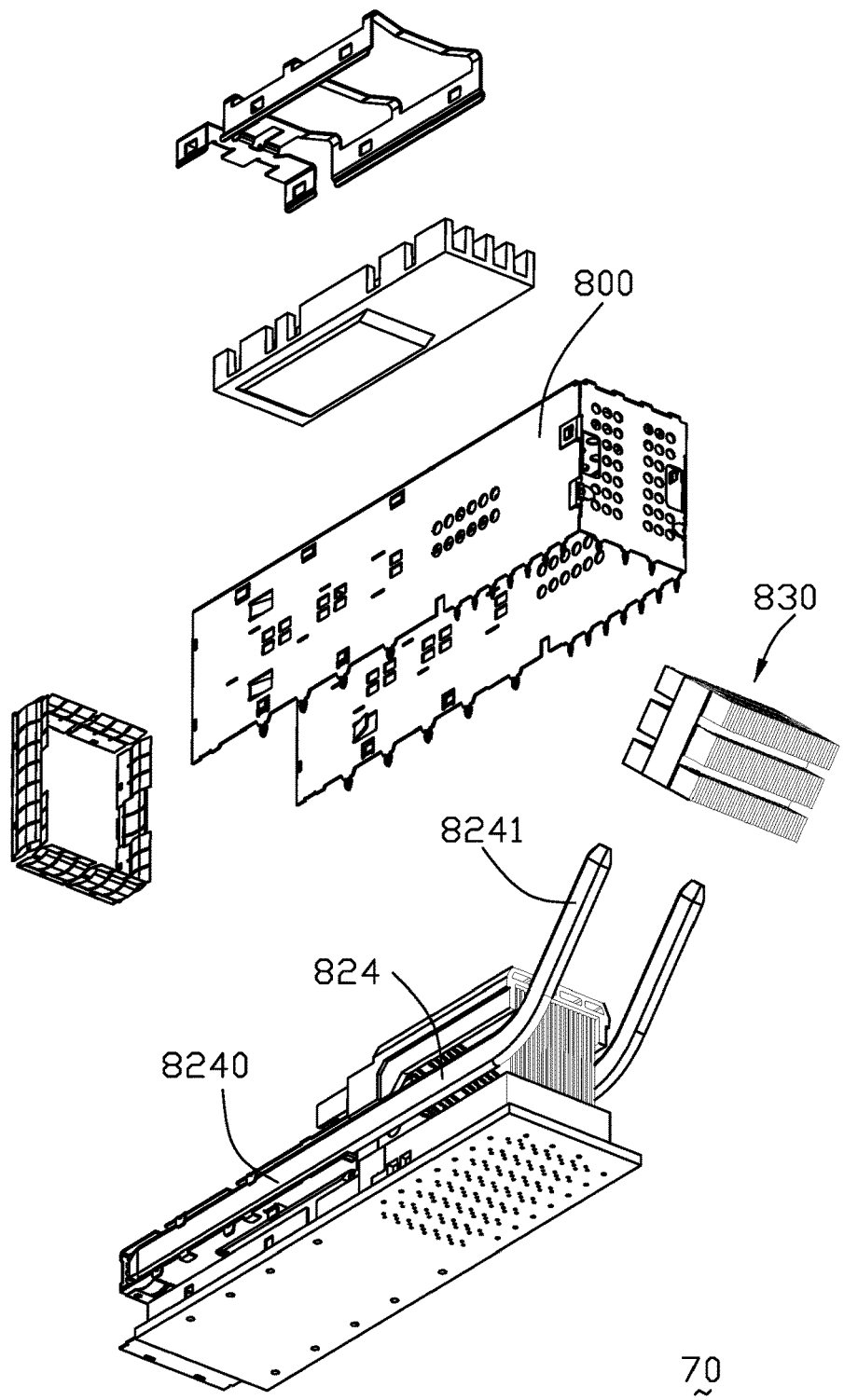
FIG. 33 is another exploded perspective view of the electrical connector assembly of FIG. 32.
Figure 34:
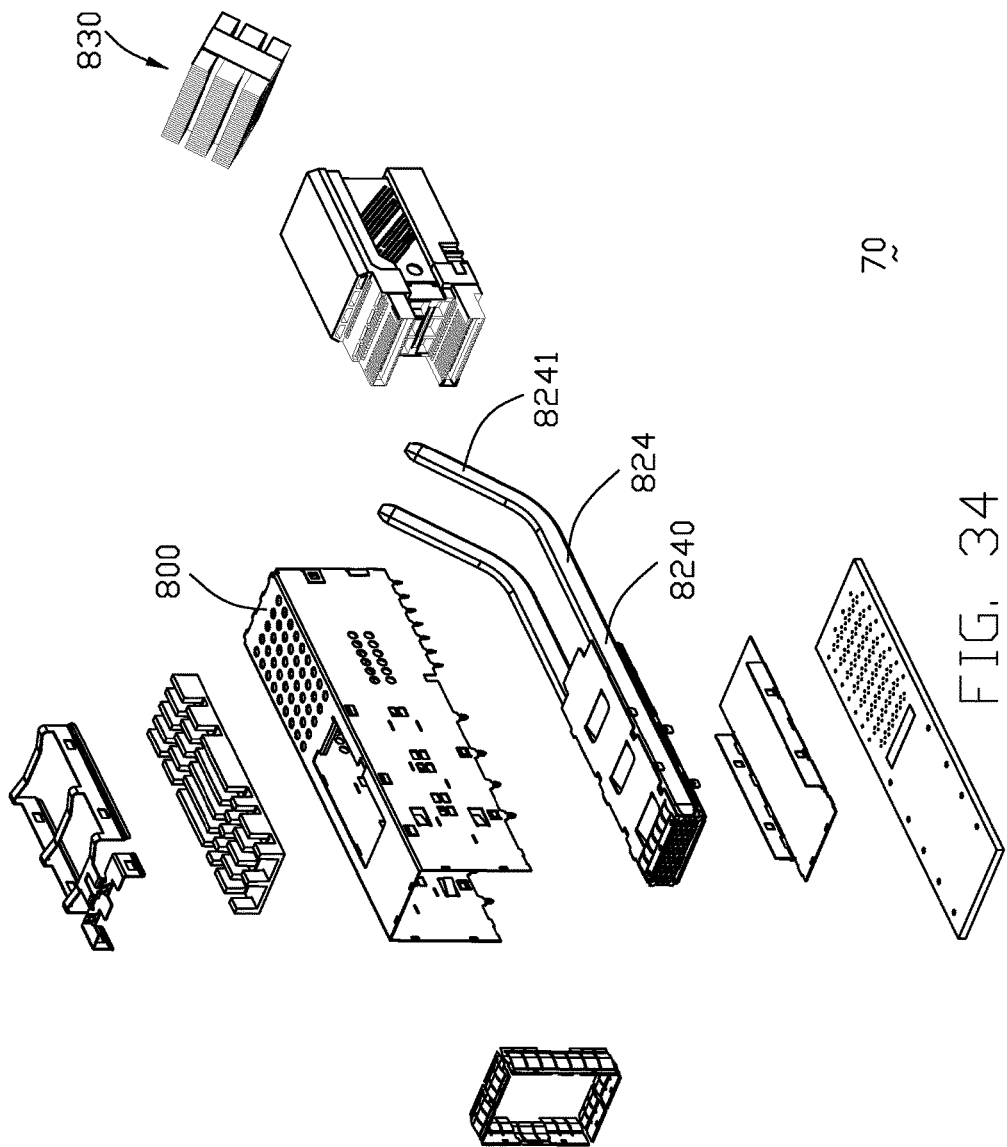
FIG. 34 is a further exploded perspective view of the electrical connector assembly of FIG. 32.
Figure 35:
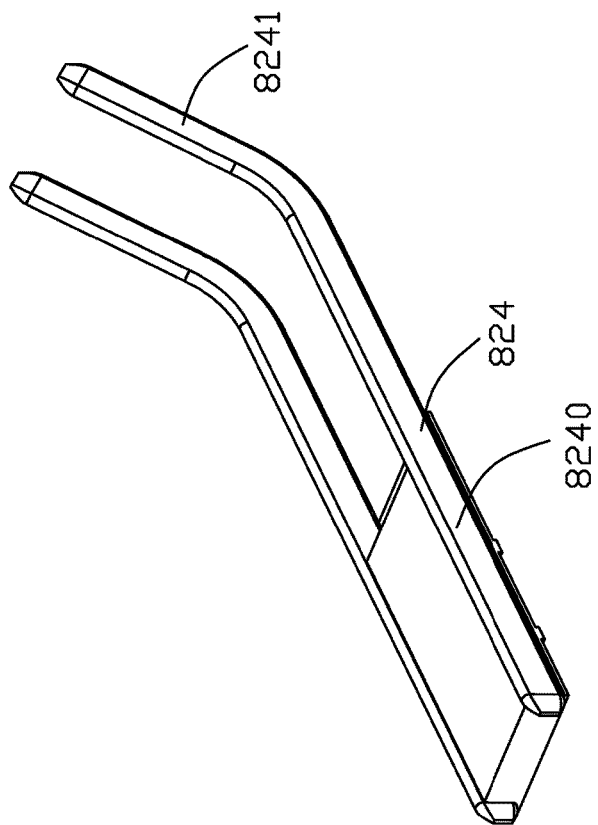
FIG. 35 is an exploded perspective view of the middle heat transfer unit of the electrical connector assembly of FIG. 30.
Figure 35:
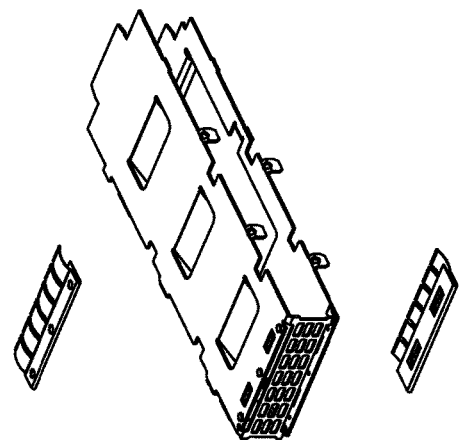
Figure 36:
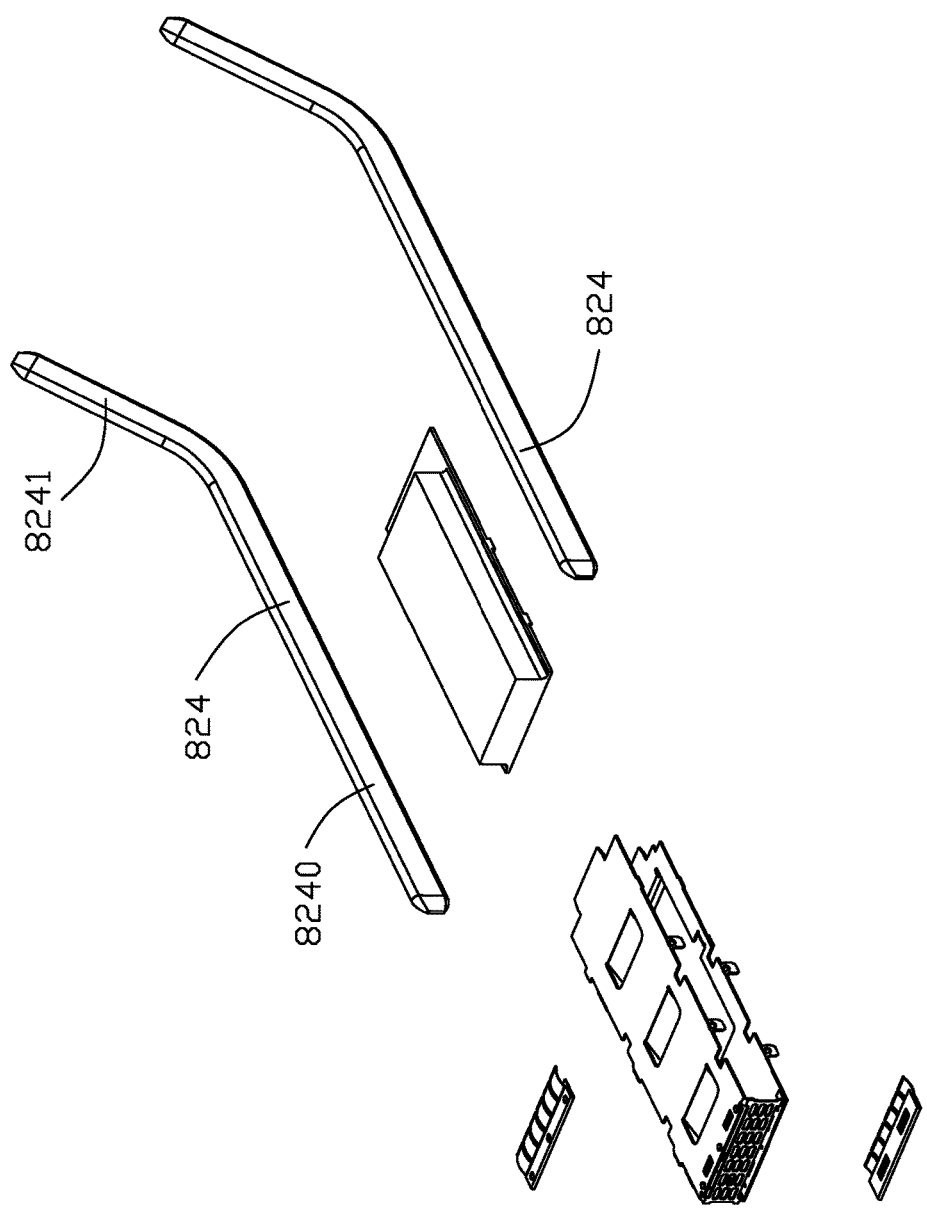
FIG. 36 is a further exploded perspective view of the middle heat transfer unit of the electrical connector assembly of FIG. 35.
Figure 37:
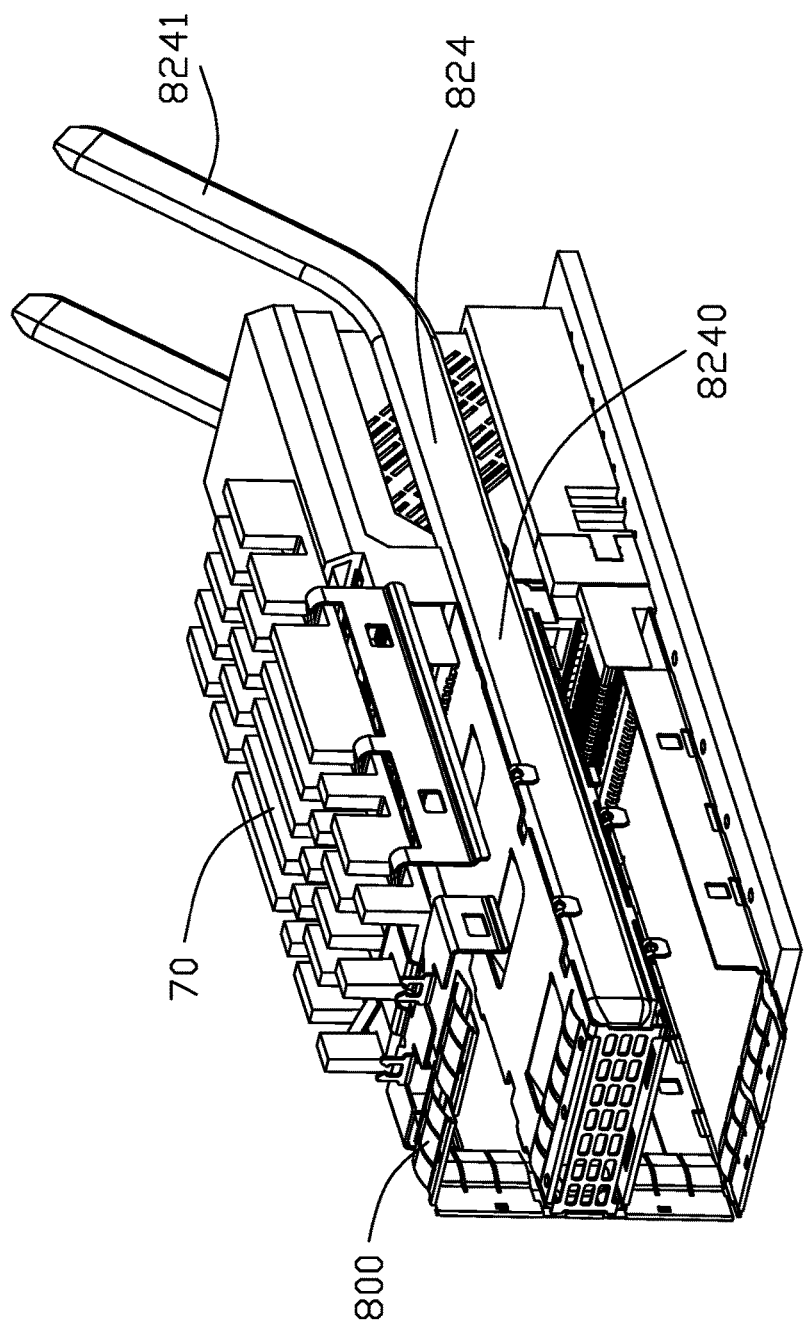
FIG. 37 is a perspective view of the electrical connector assembly of FIG. 30 by removing the side wall of the cage to show how the middle heat transfer unit and the receptacle connector unit work around the cage.
Figure 38:
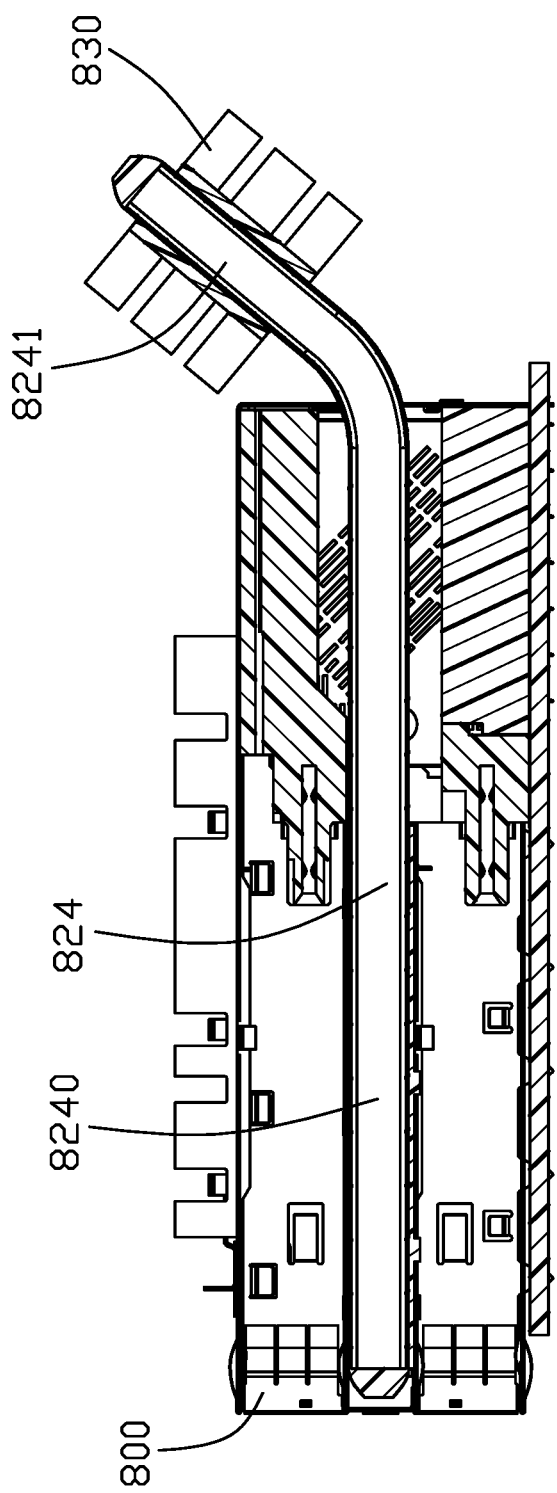
FIG. 38 is a cross-sectional view of the electrical connector of FIG. 30.
Figure 39:
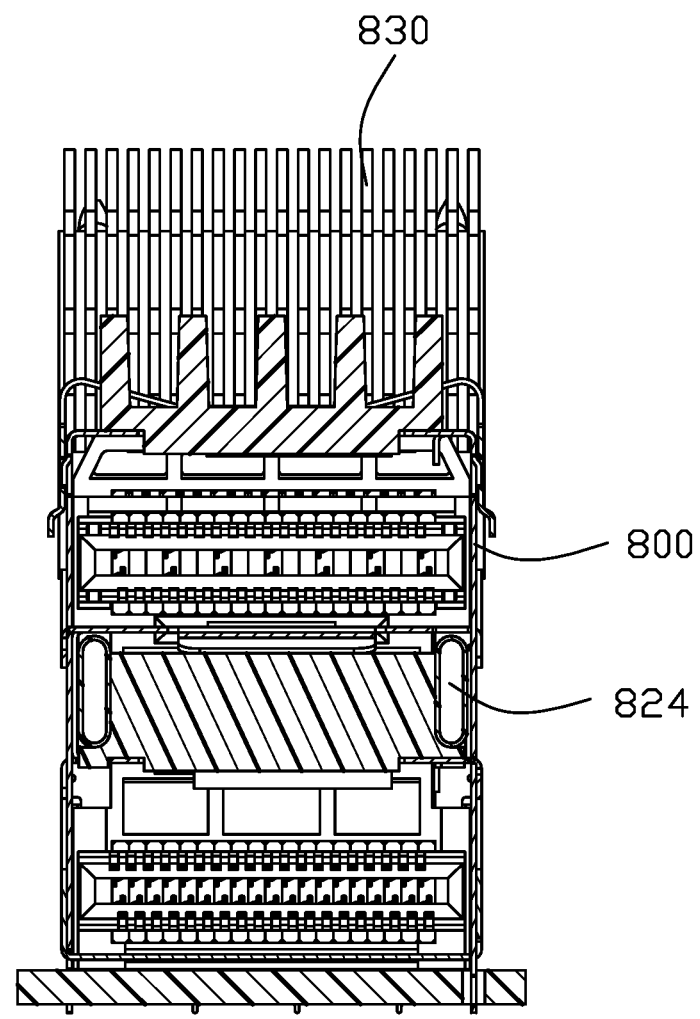
FIG. 39 is another cross-sectional view of the electrical connector of FIG. 30.

Referring to FIGS. 1-22, according to the first embodiment of the invention, an electrical connector assembly 10 includes a shielding shell or cage or metallic cage 100 to form a receiving space 101 therein, and a receptacle connector unit 200 received in the receiving space 101. The receptacle connector unit 200 includes an insulative housing 202 forming two (upper and lower) mating ports 204 spaced apart from each other in vertical direction for respectively receiving two plug connectors/modules (FIGS. 28, 29) therein, and a plurality of terminal wafers 210 stacked with one another along the transverse direction. Each of the terminal wafers 210 includes a plurality of terminals with contacting sections 212 exposed upon the corresponding mating ports 204 and tail sections 214 extending downwardly to be mounted on a printed circuit board 300 on which the electrical connector assembly 10 is mounted.

The metallic cage 100 comprises a middle (dividing) portion 102 formed by a U-shaped sheet that make the metallic cage 100 formed an upper channel 103 for a plug connector inserted into to mate with an upper one of the mating ports 204, and a lower channel 104 for another plug connector inserted into to mate with a lower one of the mating ports 204. The middle portion 102 comprises a top wall 1020 comprising a plurality of spring tabs 1021 extending inclined and downwardly, a bottom wall 1022 defining a bottom through hole 1023, a middle receiving portion 1024 between the top wall 1020 and the bottom wall 1022, and a pair of spring plates 1025 attached upon the middle portion 102. The metallic cage 100 defines a plurality of through holes 105 in side walls and in communication with the middle portion 102.

Figure 1:
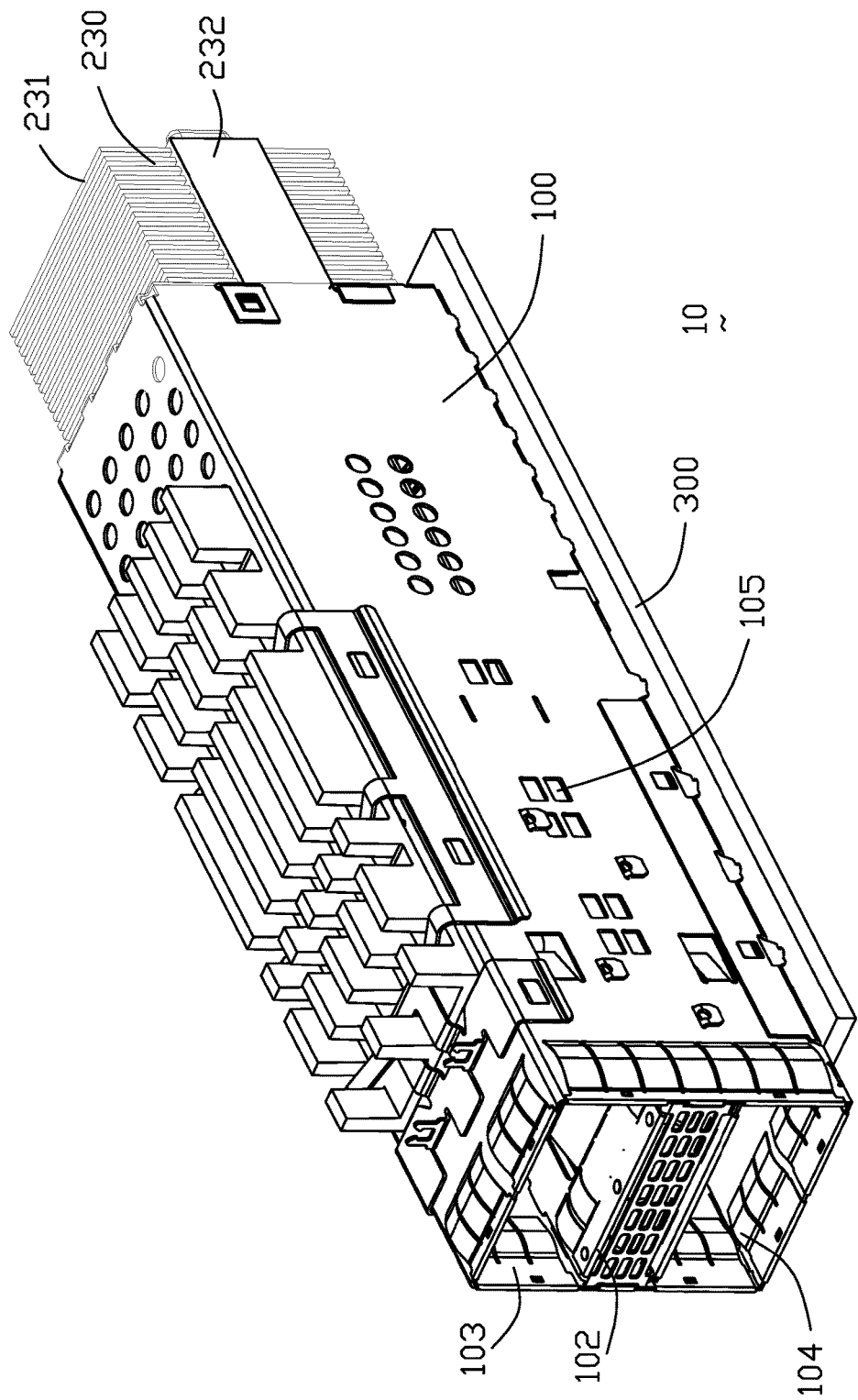
FIG. 1 is a perspective view of an electrical connector assembly according to a first embodiment of the present invention.
Figure 2:
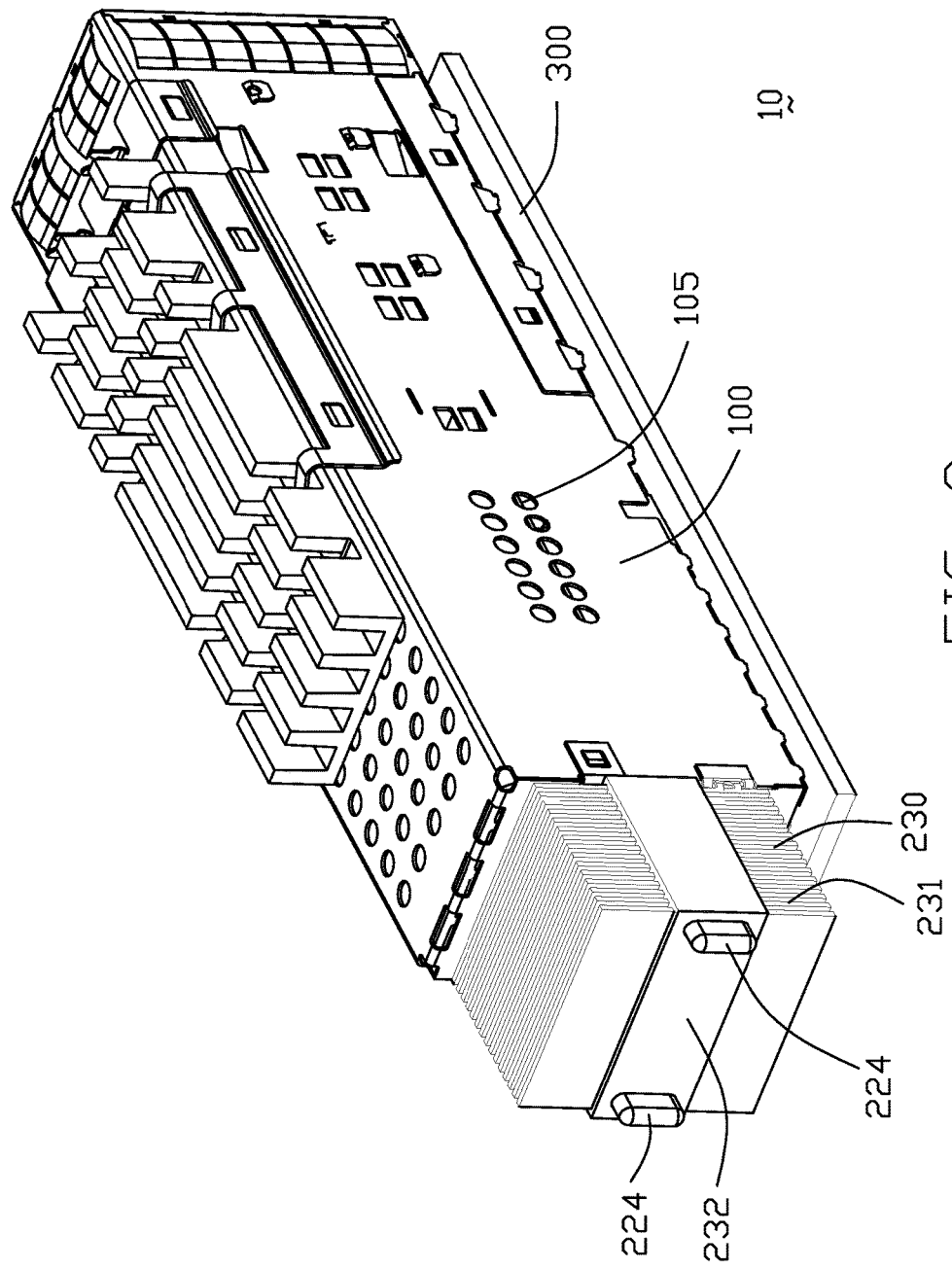
FIG. 2 is another perspective view of the electrical connector assembly of FIG. 1.
Figure 3:
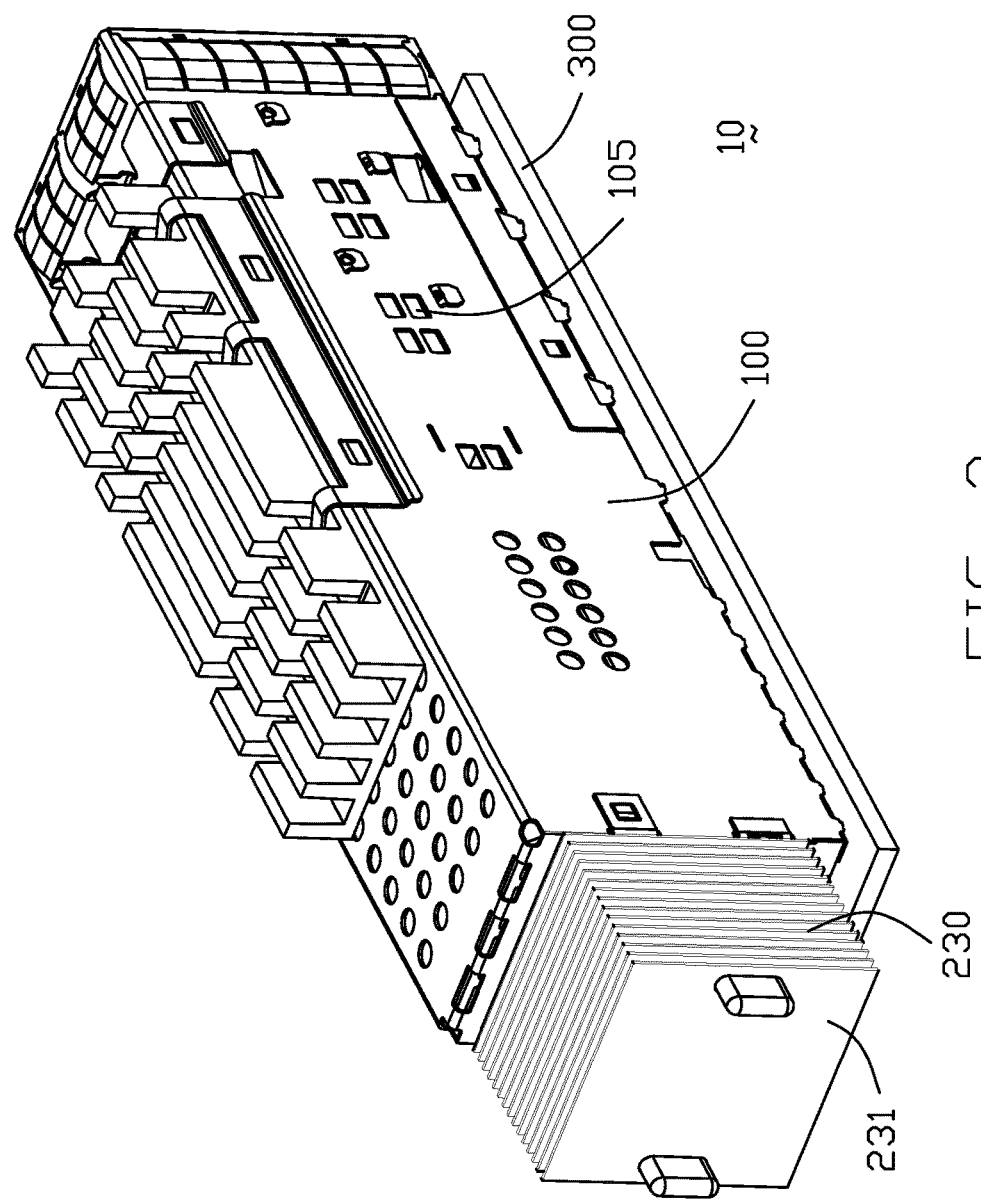
FIG. 3 is a perspective view of the electrical connector assembly of FIG. 1 wherein a retaining clip of the rear heat sink unit is removed therefrom.
Figure 4:
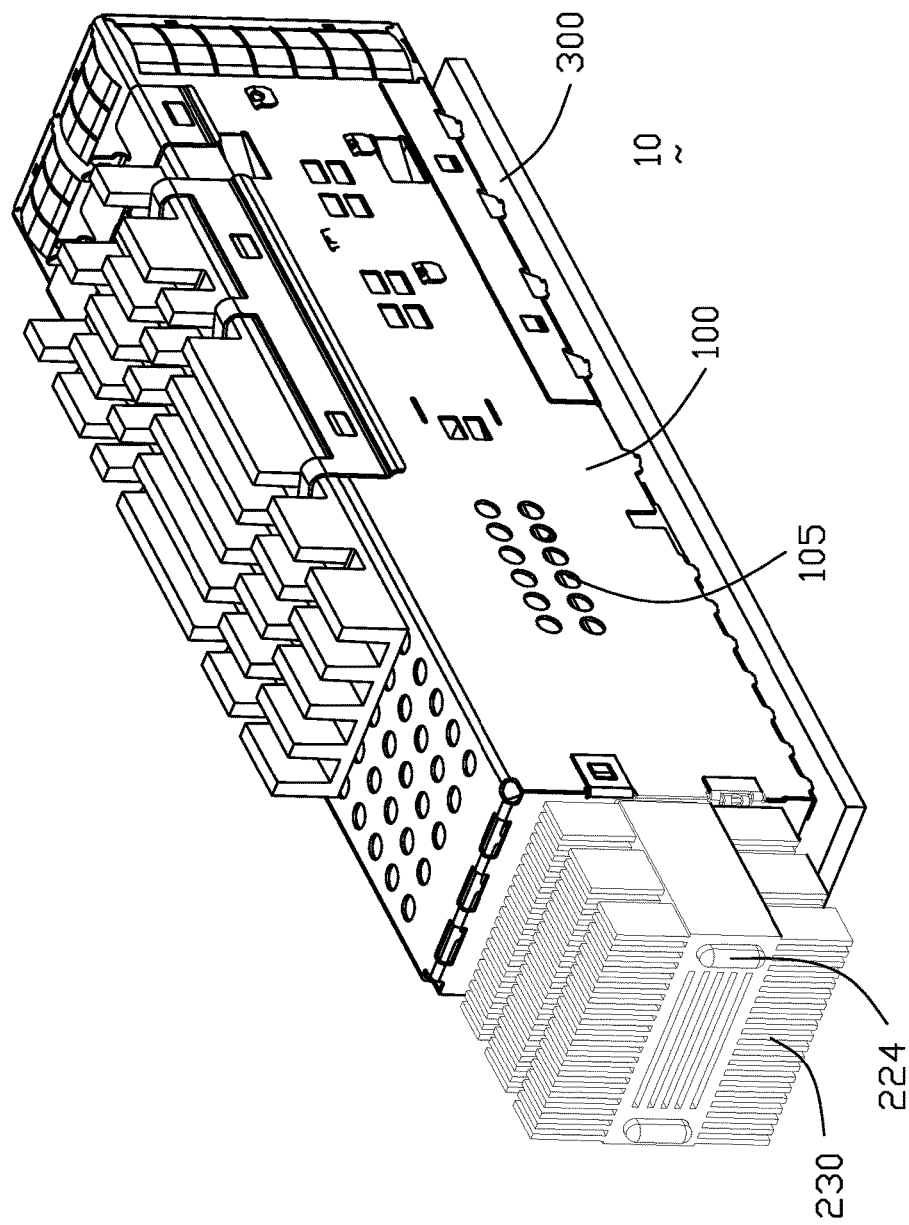
FIG. 4 is a perspective view of the electrical connector assembly similar to what is shown in FIG. 1 except the rear heat sink unit is of a different type.
Figure 5:
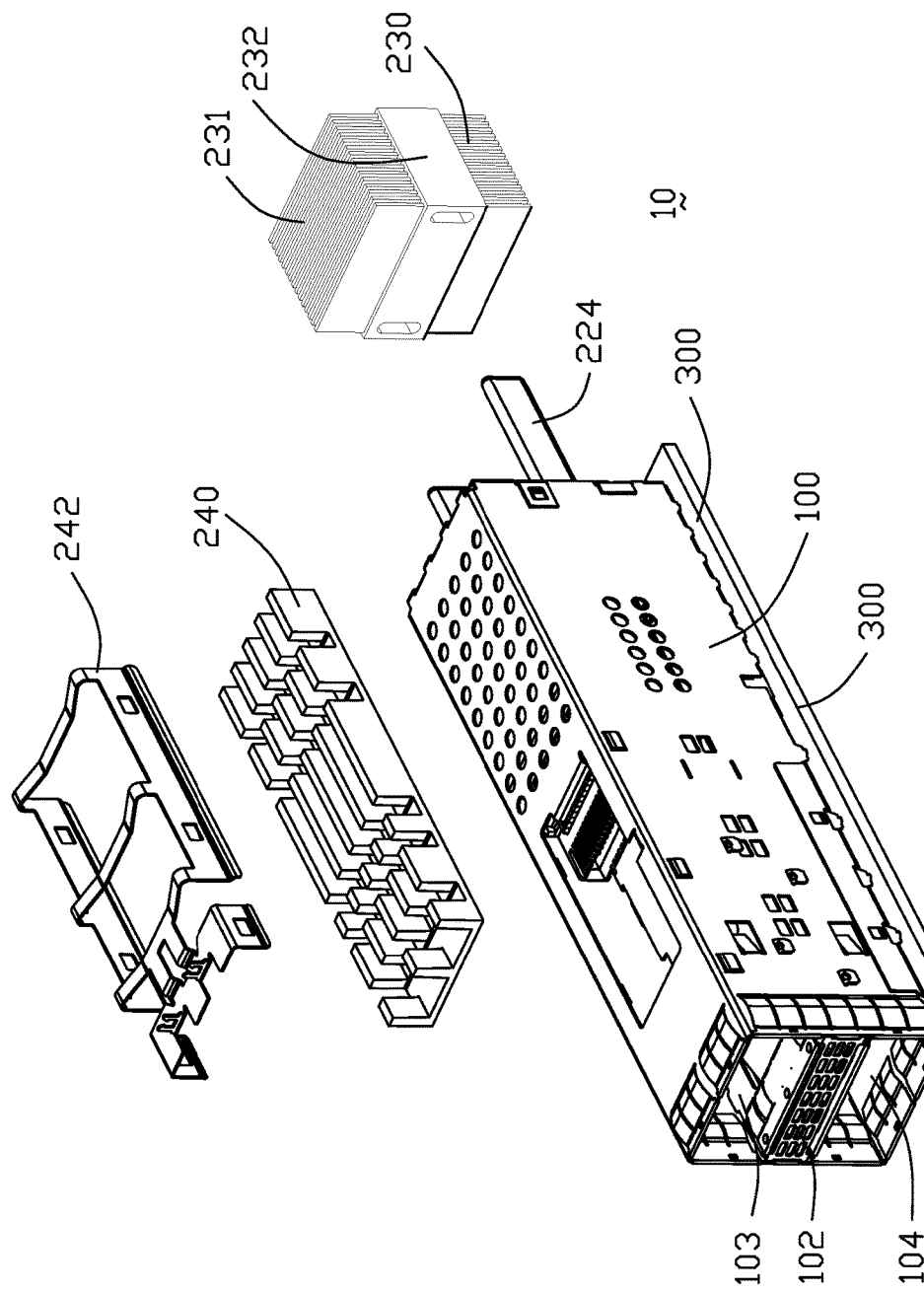
FIG. 5 is an exploded perspective view of an electrical connector assembly of FIG. 1.
Figure 6:
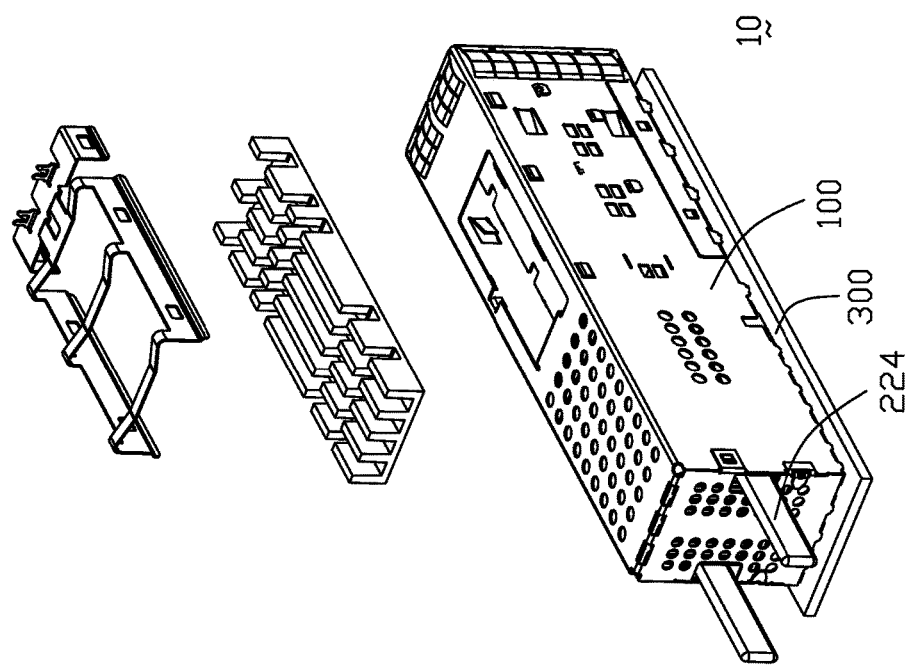
FIG. 6 is another exploded perspective view of the electrical connector assembly of FIG. 5.
Figure 7:
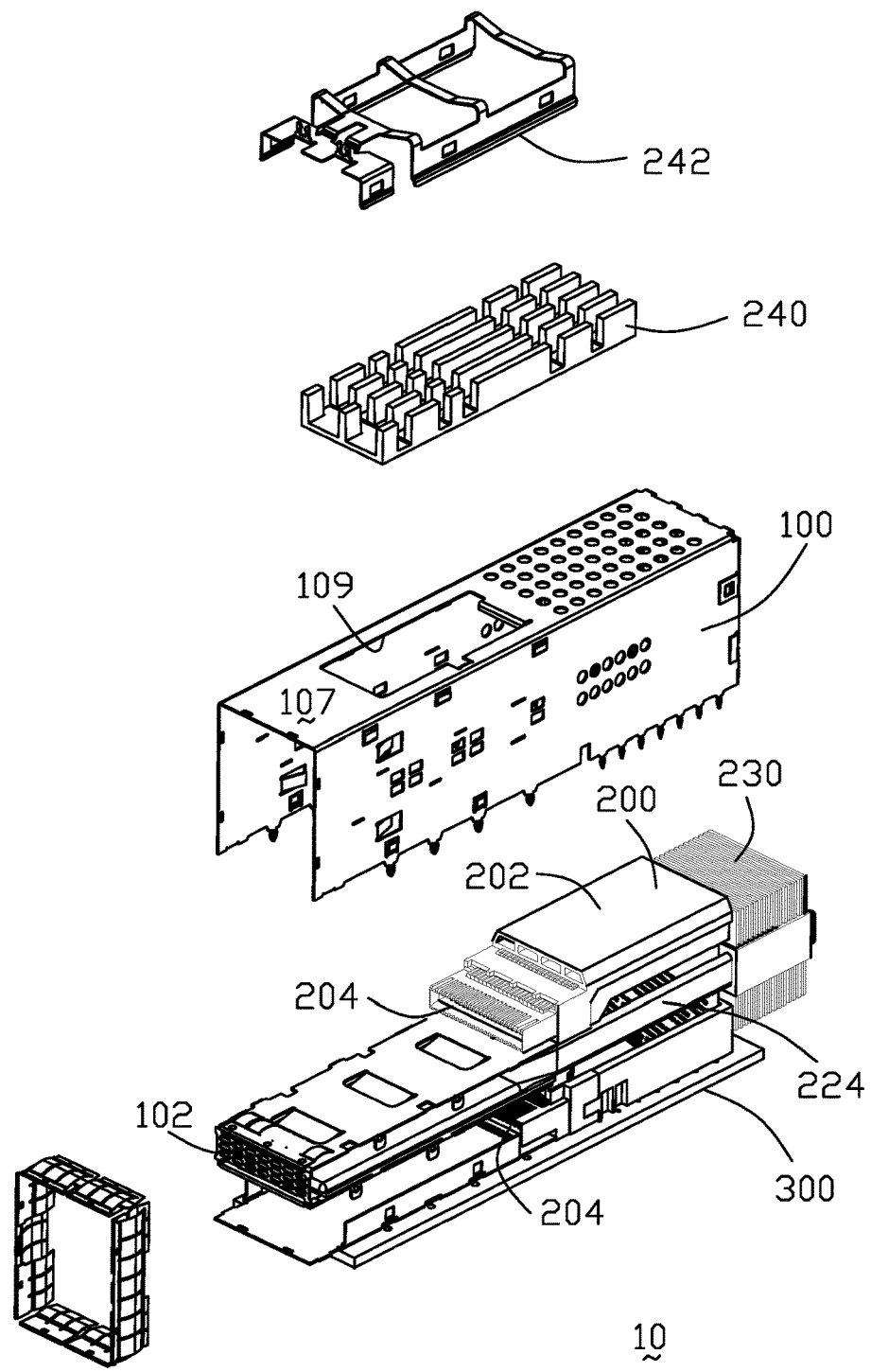
FIG. 7 is a further exploded perspective view of the electrical connector assembly of FIG. 5.
Figure 8:
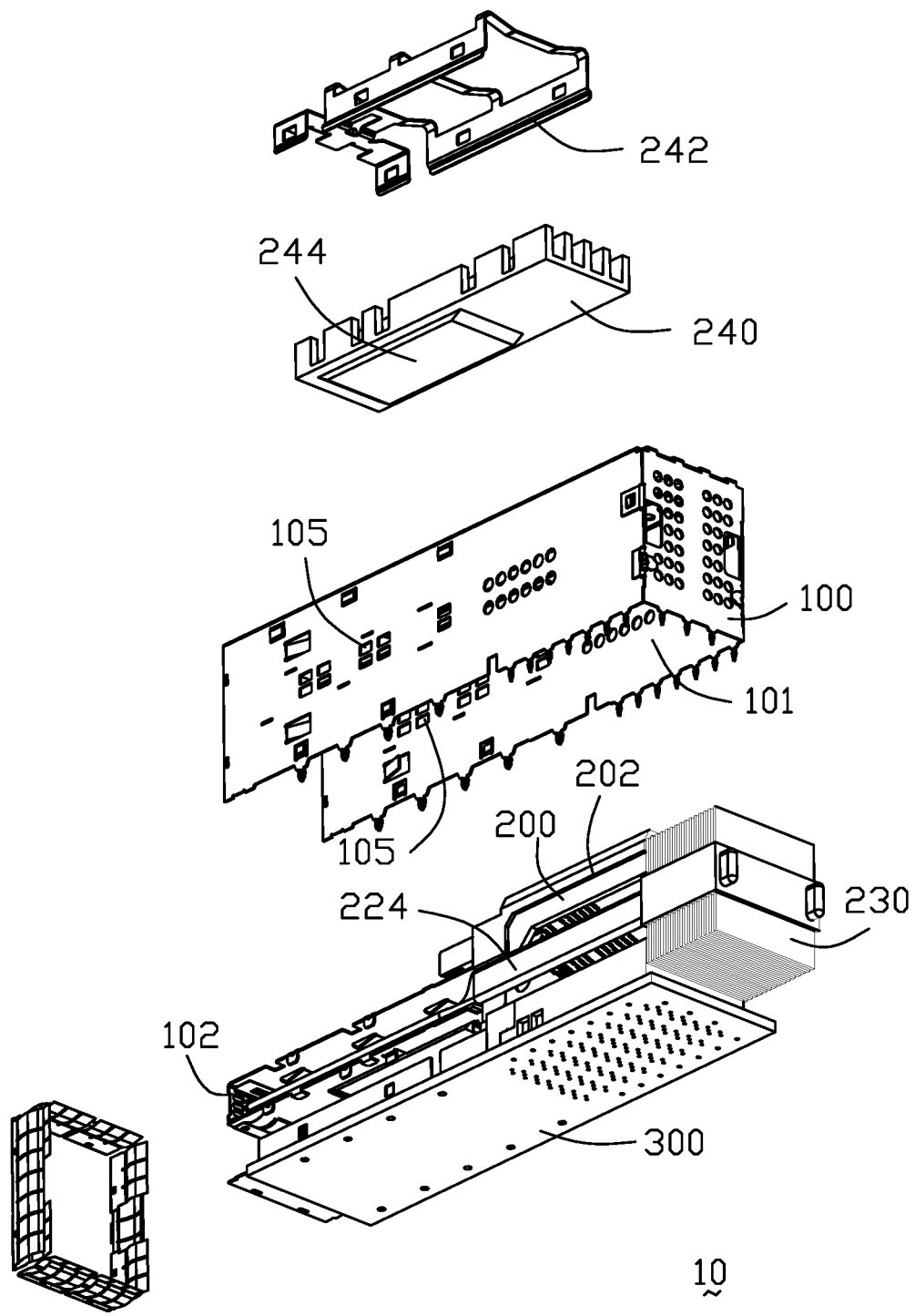
FIG. 8 is another exploded perspective view of the electrical connector assembly of FIG. 7.
Figure 9:
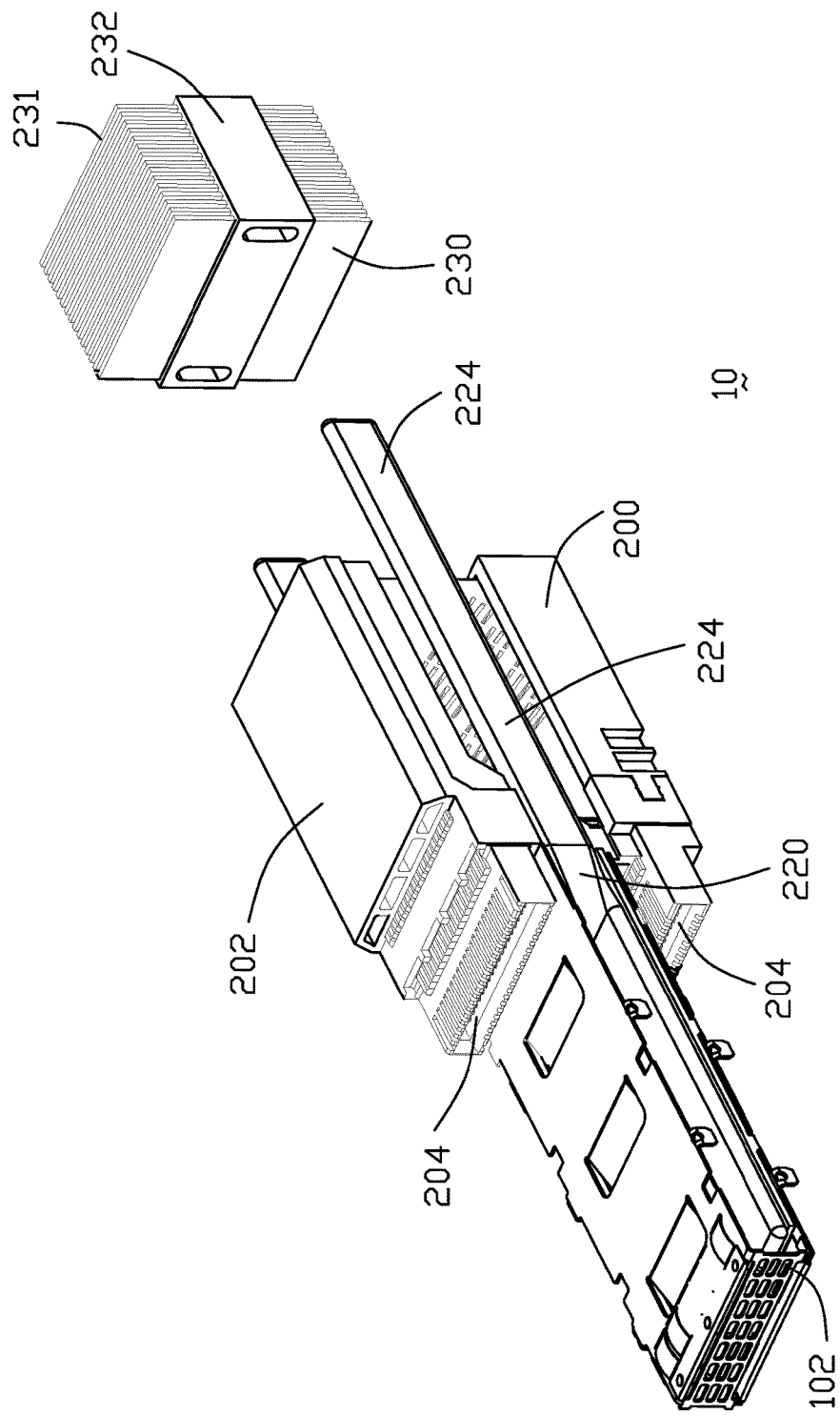
FIG. 9 is an exploded perspective view of the receptacle connector unit and the middle heat transfer unit of the electrical connector assembly of FIG. 1.
Figure 10:
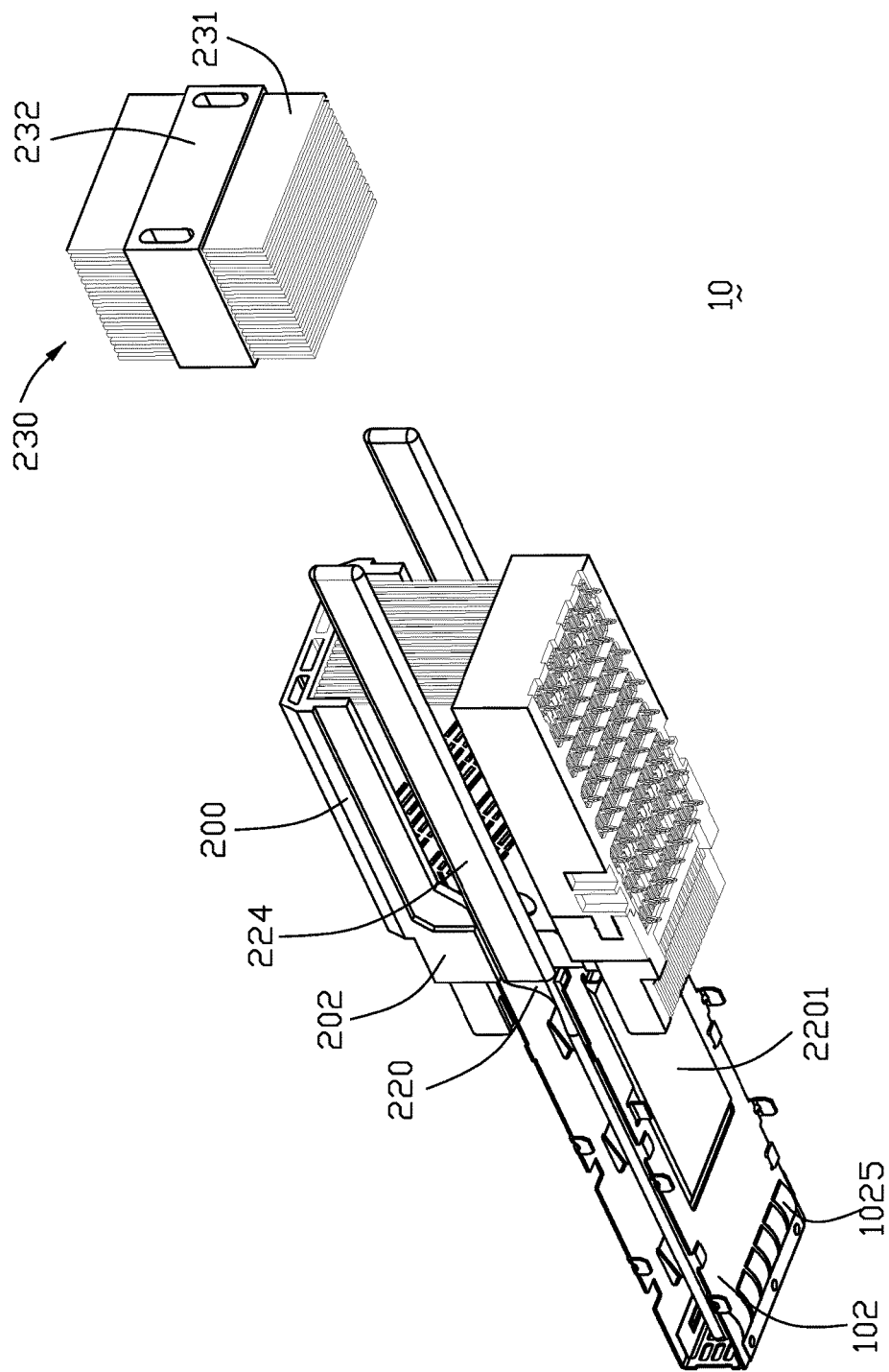
FIG. 10 is another exploded perspective view of the receptacle connector unit and the middle heat transfer unit of the electrical connector of FIG. 9.
Figure 11:
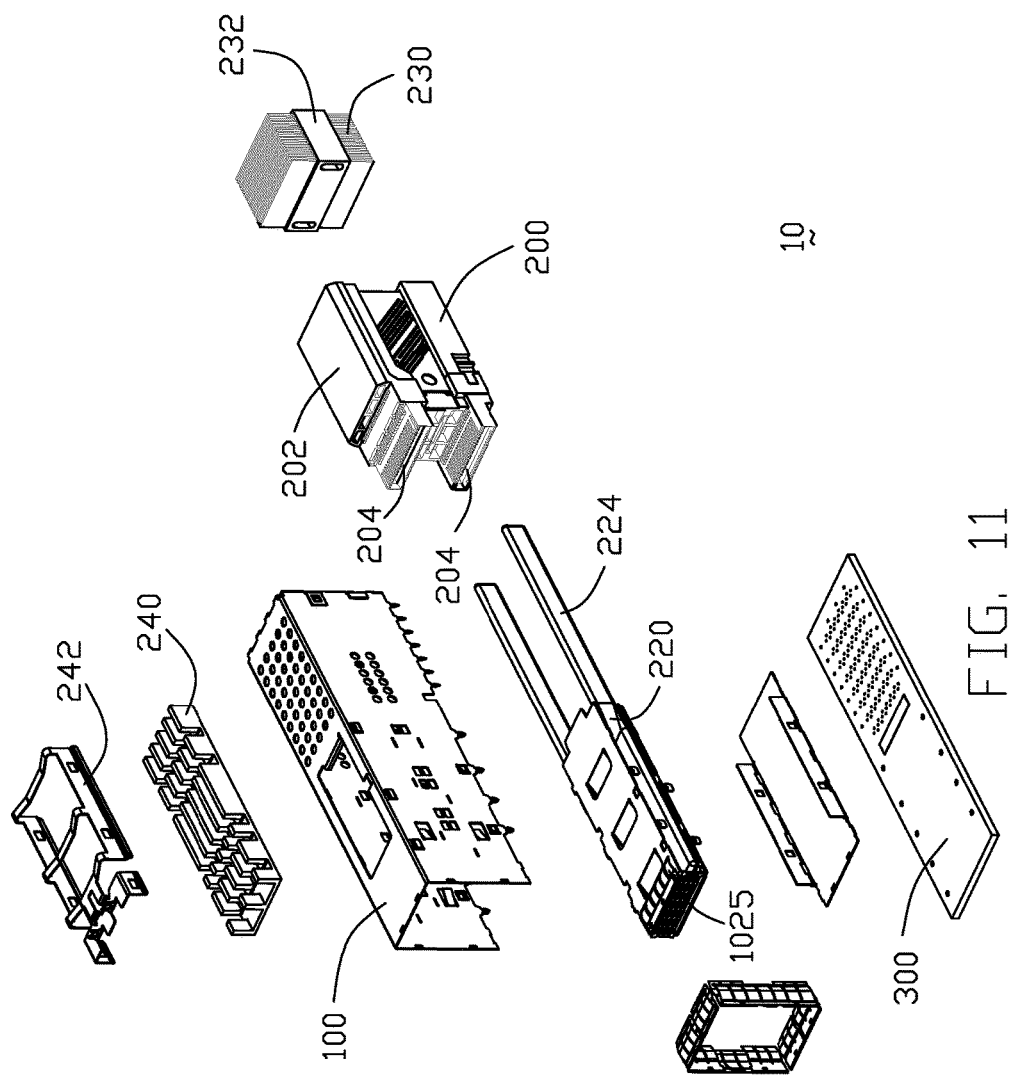
FIG. 11 is a further exploded perspective view of the receptacle connector unit and the middle heat transfer unit of the electrical connector assembly of FIG. 7.
Figure 12:
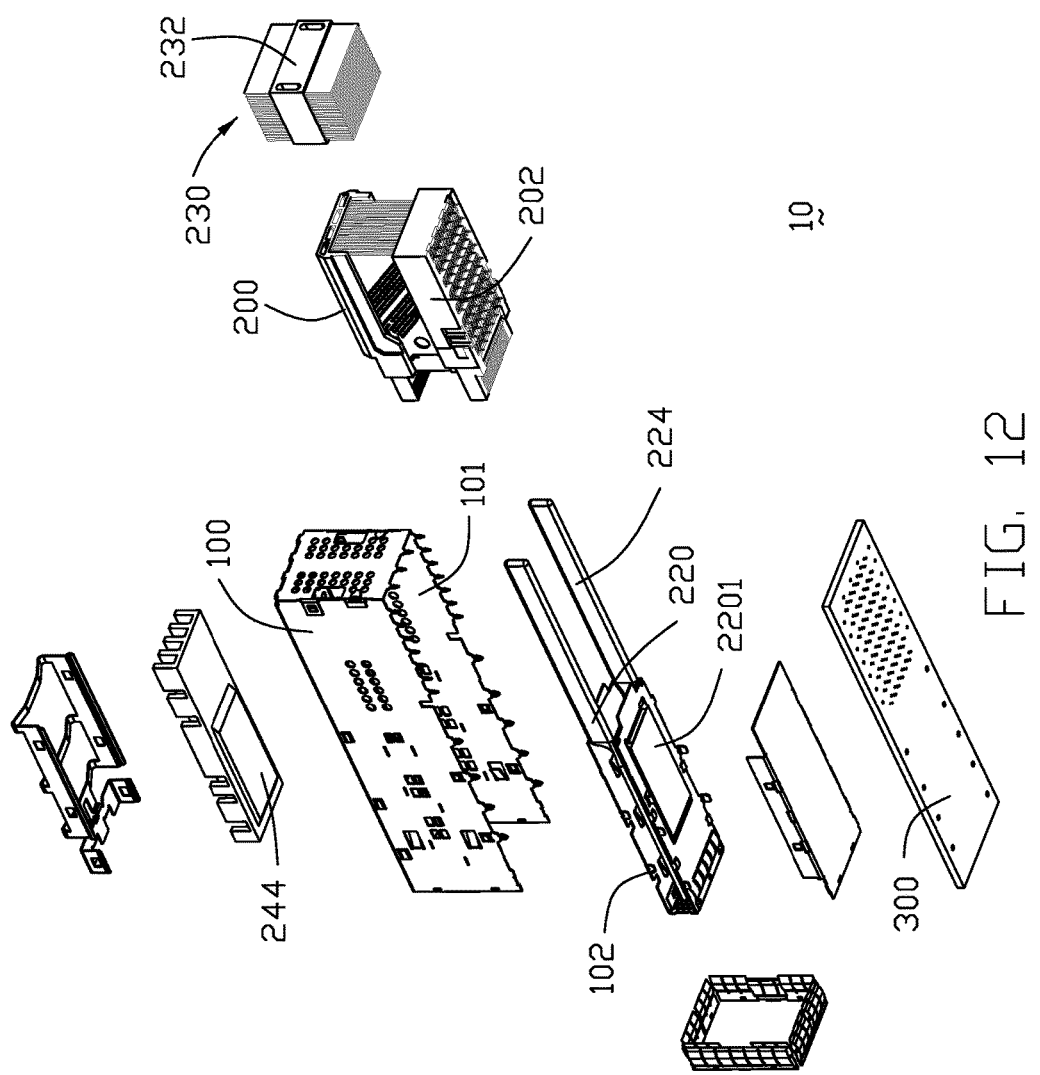
FIG. 12 is another perspective exploded view of receptacle connector unit and the middle heat transfer unit of the electrical connector assembly of FIG. 11.
Figure 13:
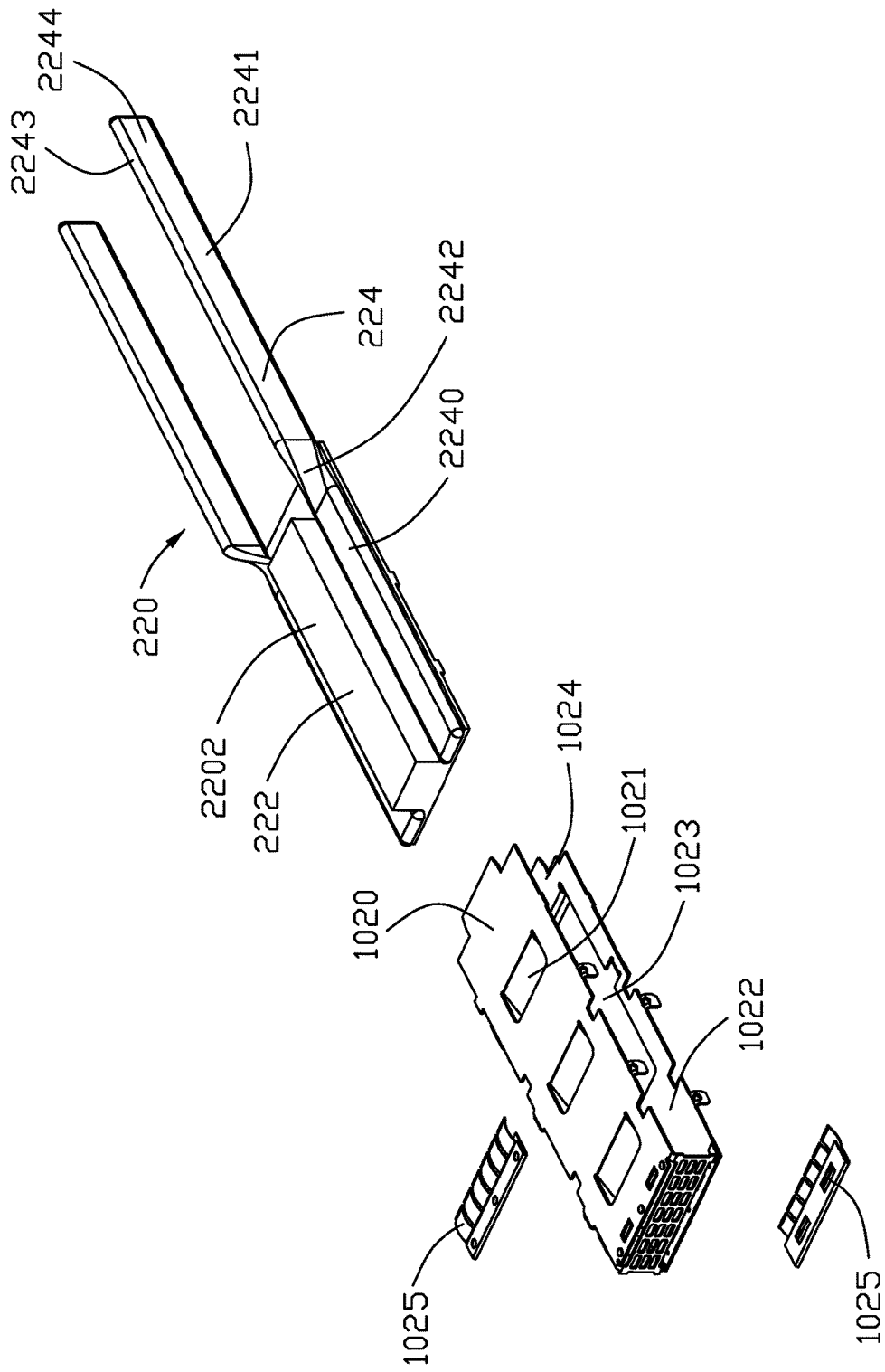
FIG. 13 is an exploded perspective view of middle heat transfer unit of the electrical connector assembly of FIG. 1.
Figure 14:
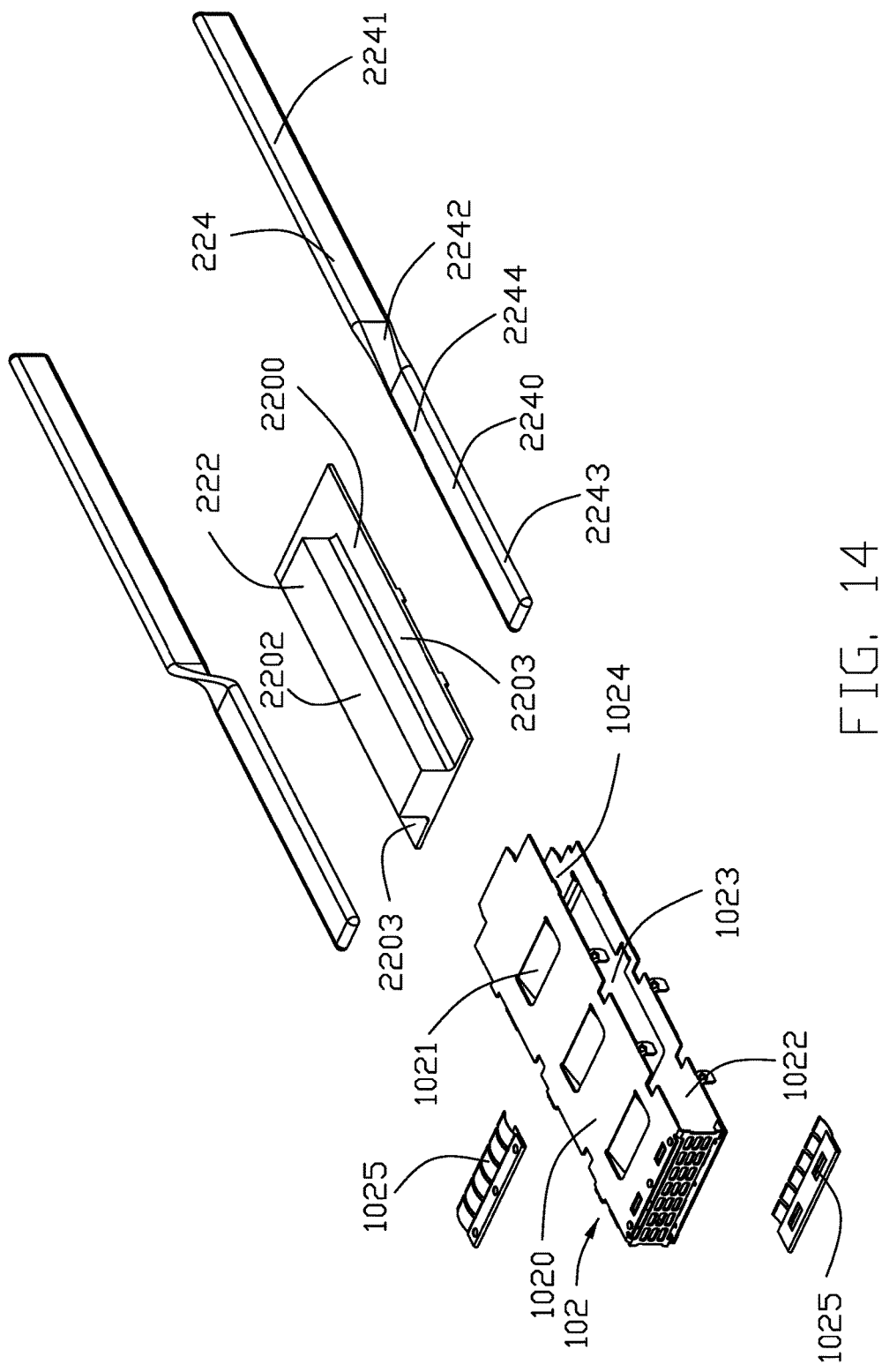
FIG. 14 is a further exploded perspective view of the middle heat transfer unit of the electrical connector assembly of FIG. 13.
Figure 15:
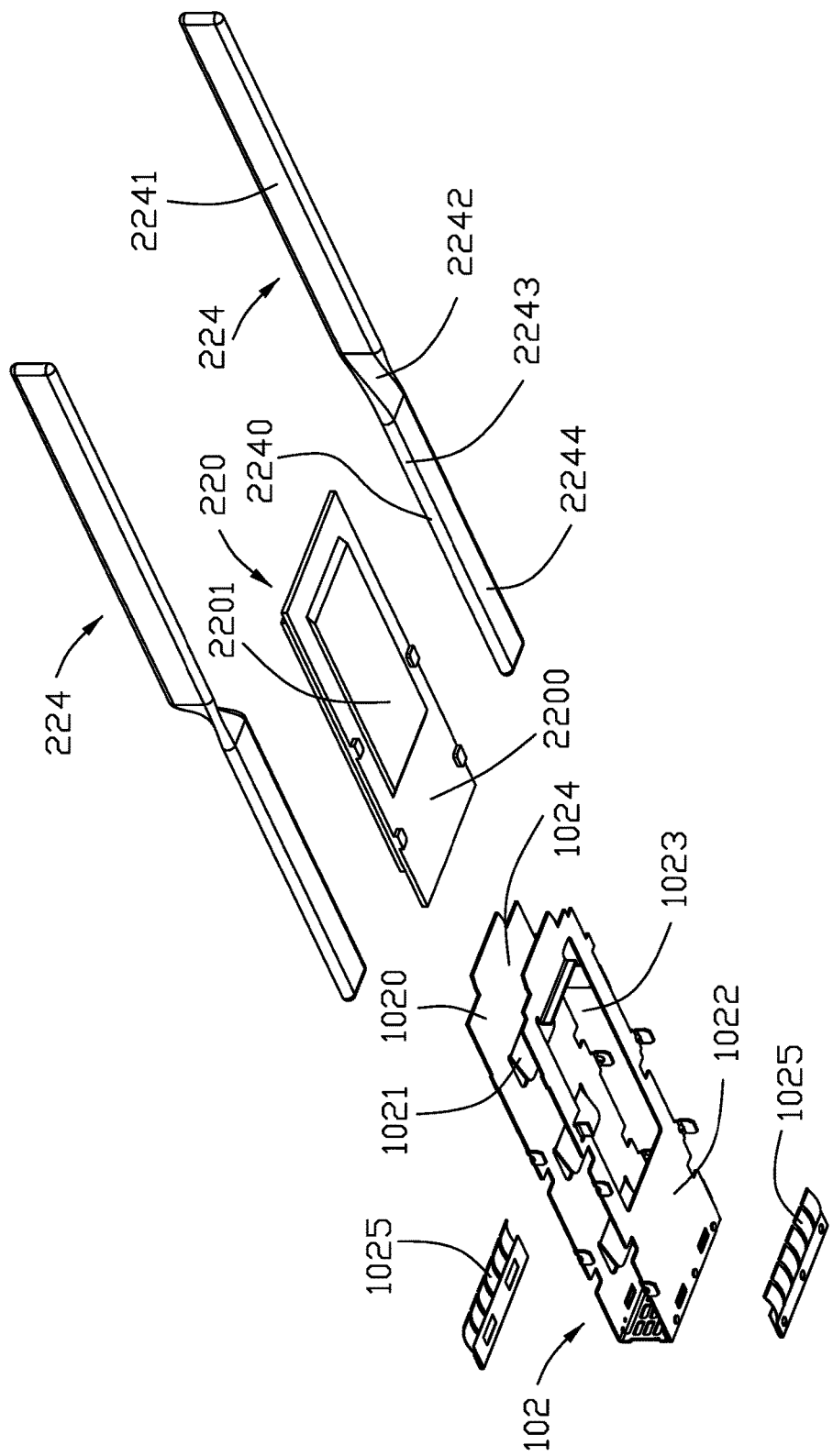
FIG. 15 is another exploded perspective view of the middle heat transfer unit of the electrical connector assembly of FIG. 14.
Figure 16:
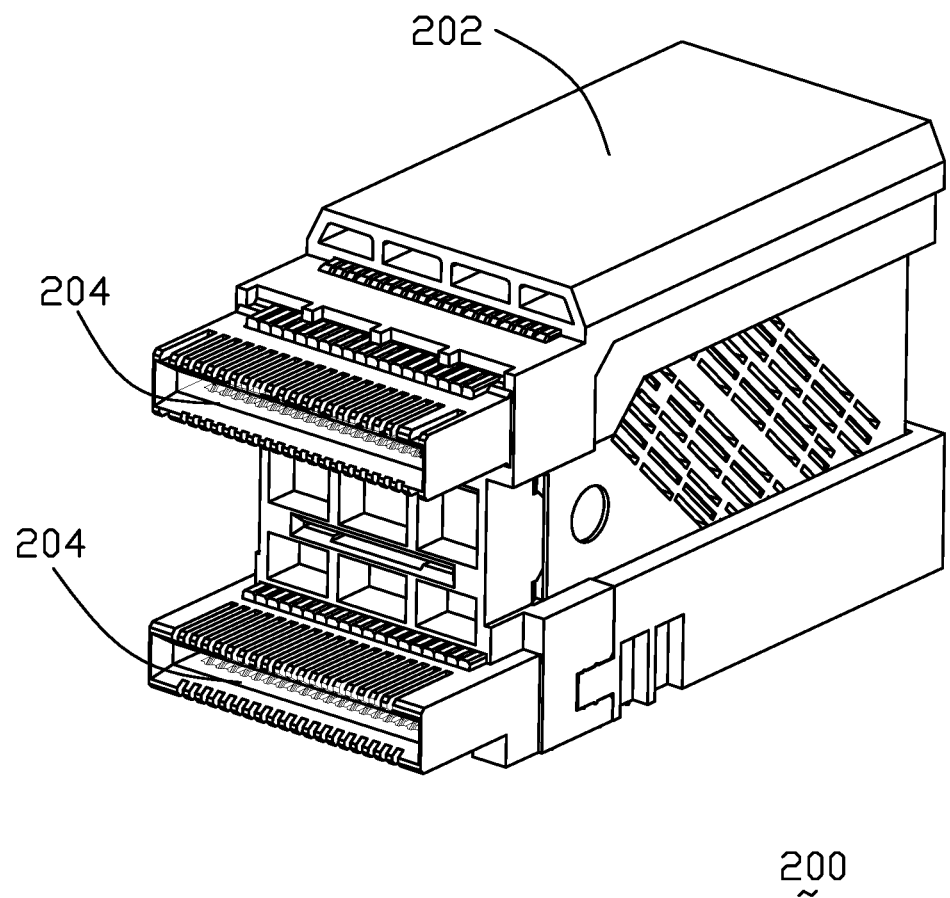
FIG. 16 is a perspective view of the receptacle connector unit of the electrical connector assembly of FIG. 1.
Figure 17:
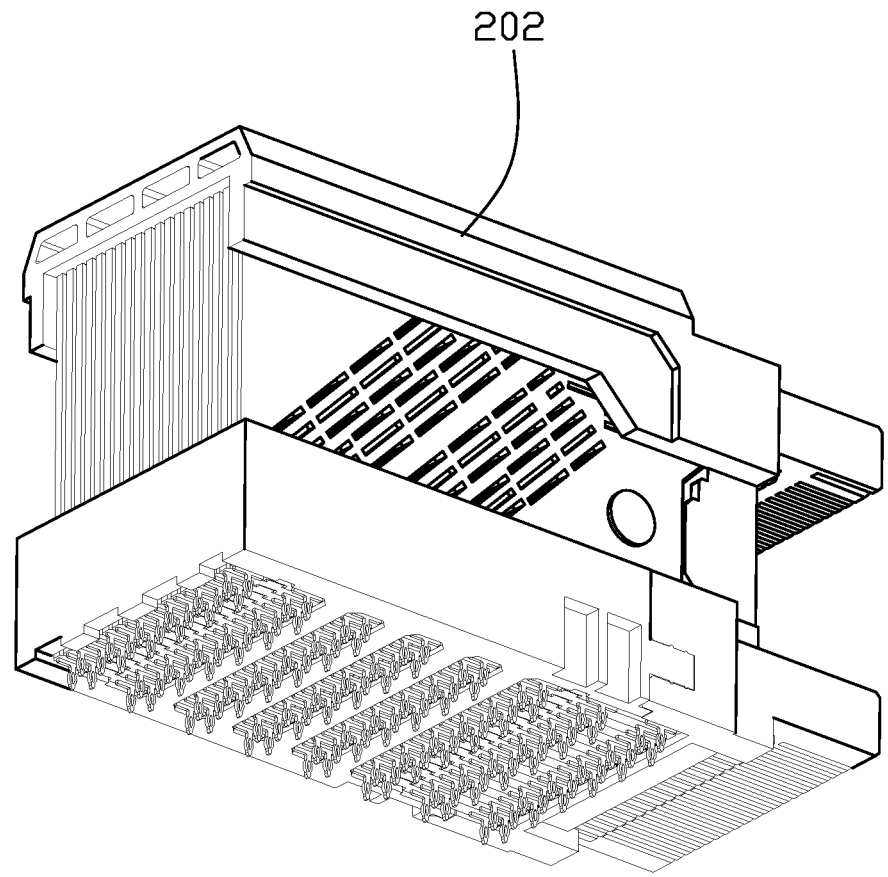
FIG. 17 is another perspective view of the electrical receptacle unit of the electrical connector assembly of FIG. 16.
Figure 18:
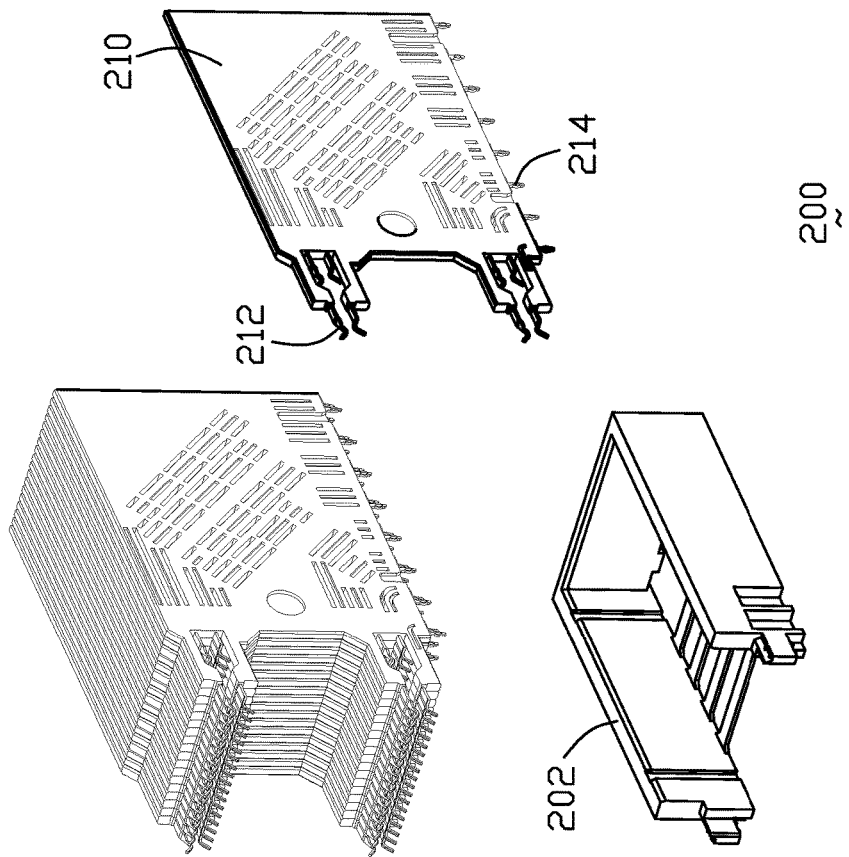
FIG. 18 is an exploded perspective view of the receptacle connector unit of FIG. 16.
Figure 18:
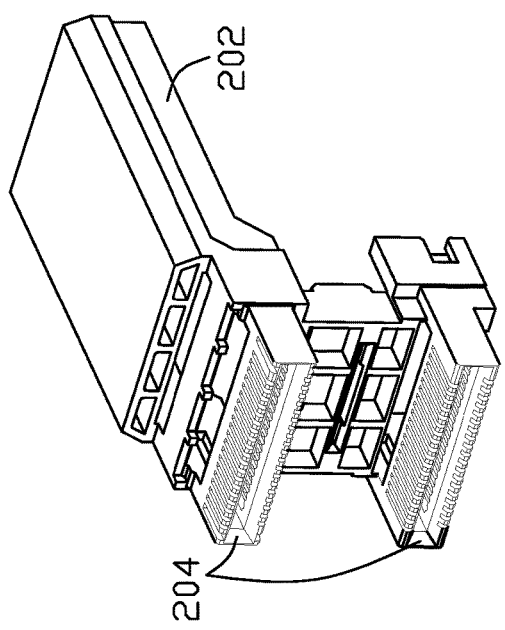
Figure 19:
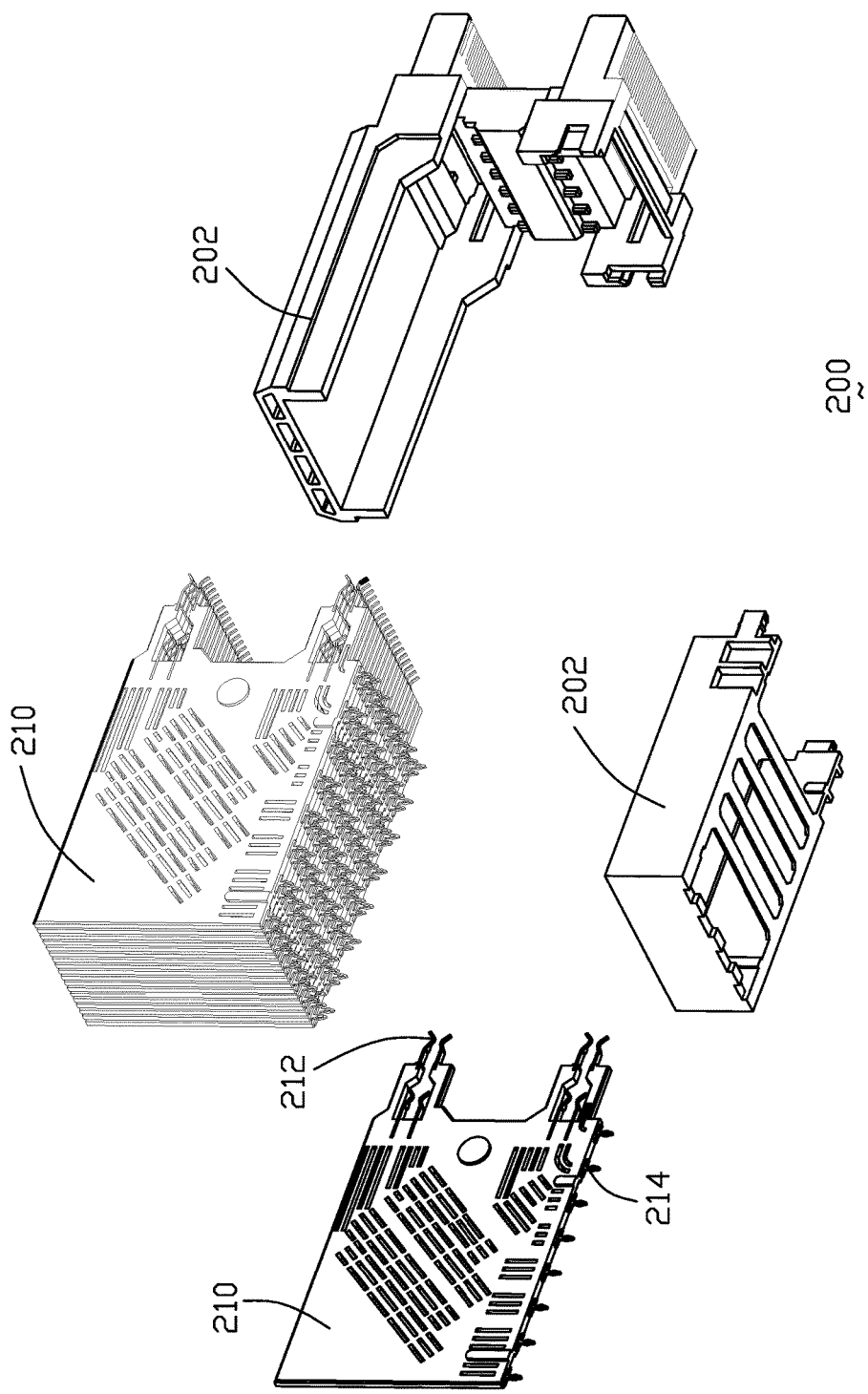
FIG. 19 is an exploded perspective view of the receptacle connector unit of FIG. 17.
Figure 20:
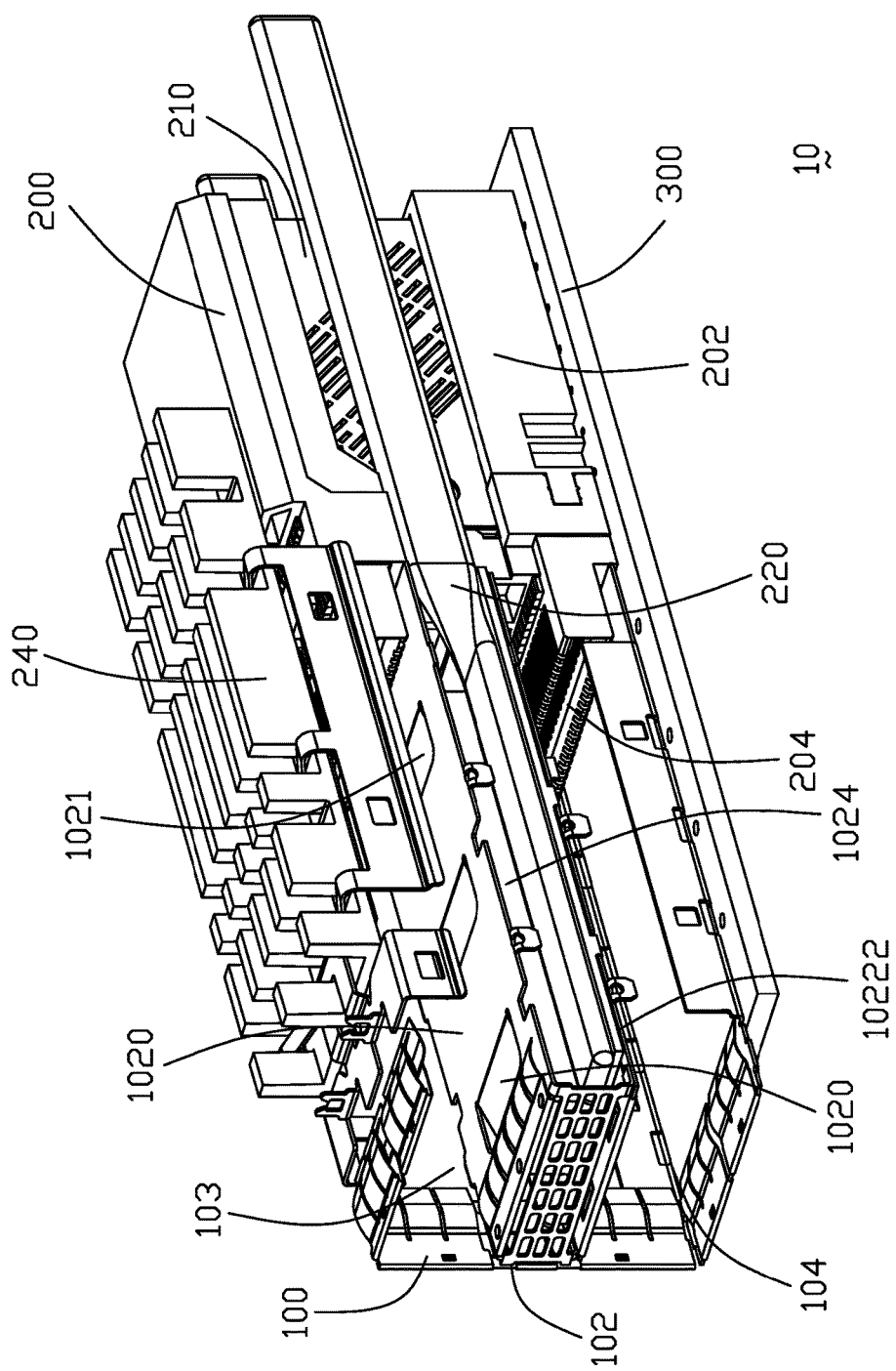
FIG. 20 is a perspective view of the electrical connector assembly of FIG. 1 by removing a side wall of the cage to show how the middle heat transfer unit, the receptacle connector unit work around the cage.
Figure 21:
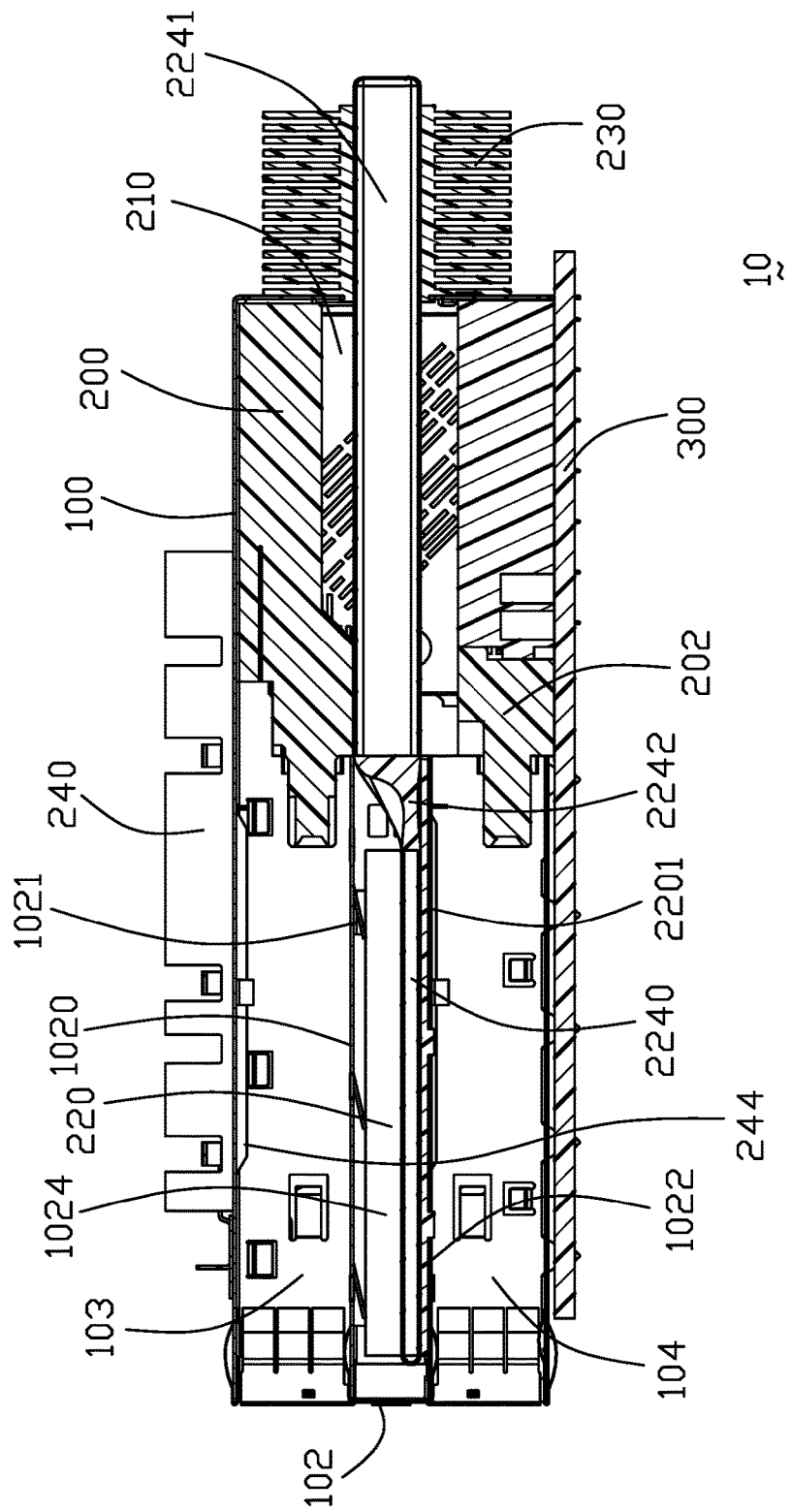
FIG. 21 is a cross-sectional view of the electrical connector assembly of FIG. 1.
Figure 22:
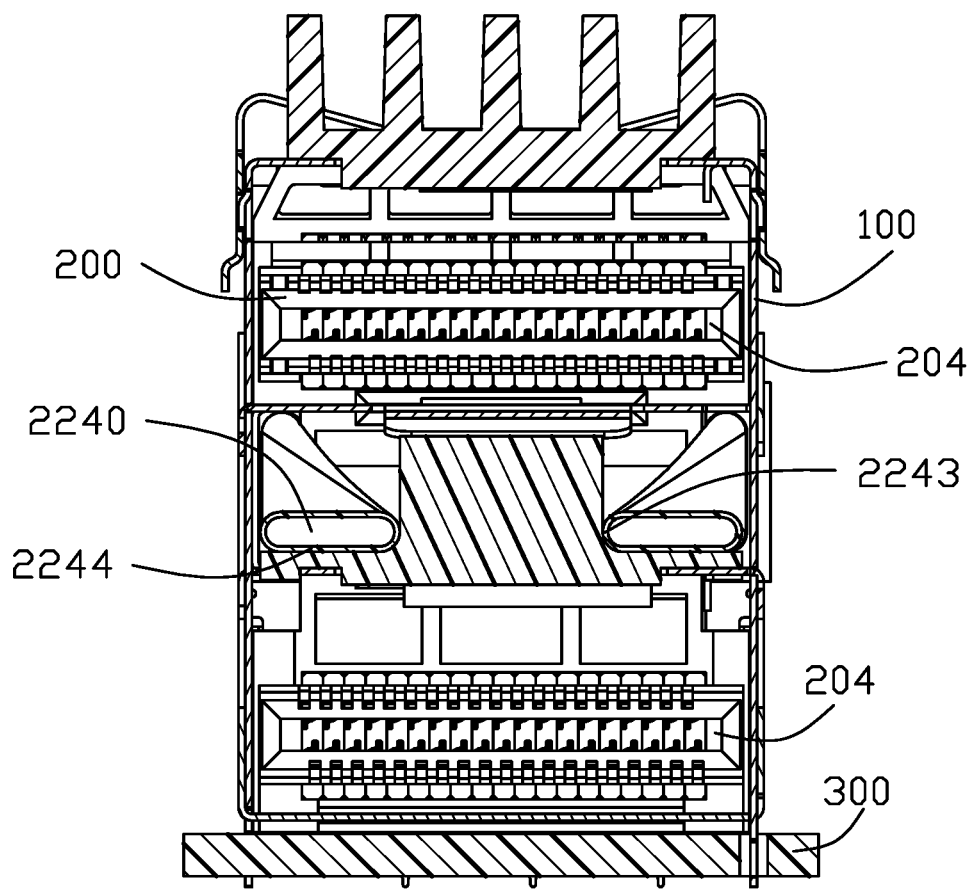
FIG. 22 is another cross-sectional view or the electrical connector assembly of FIG. 1.
Figure 23:
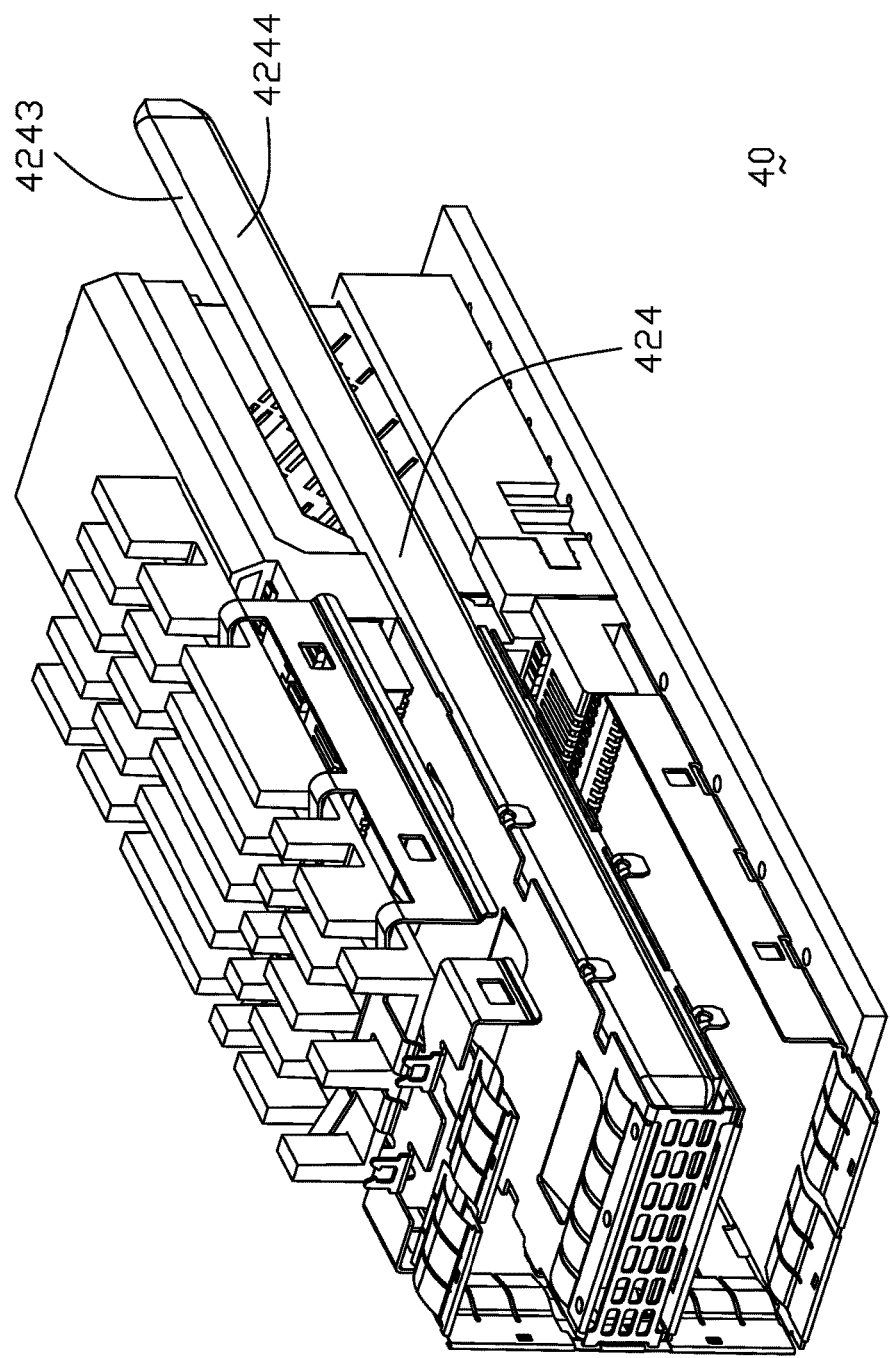
FIG. 23 is a perspective view of the electrical connector assembly according to a second embodiment of the invention.
Figure 24:
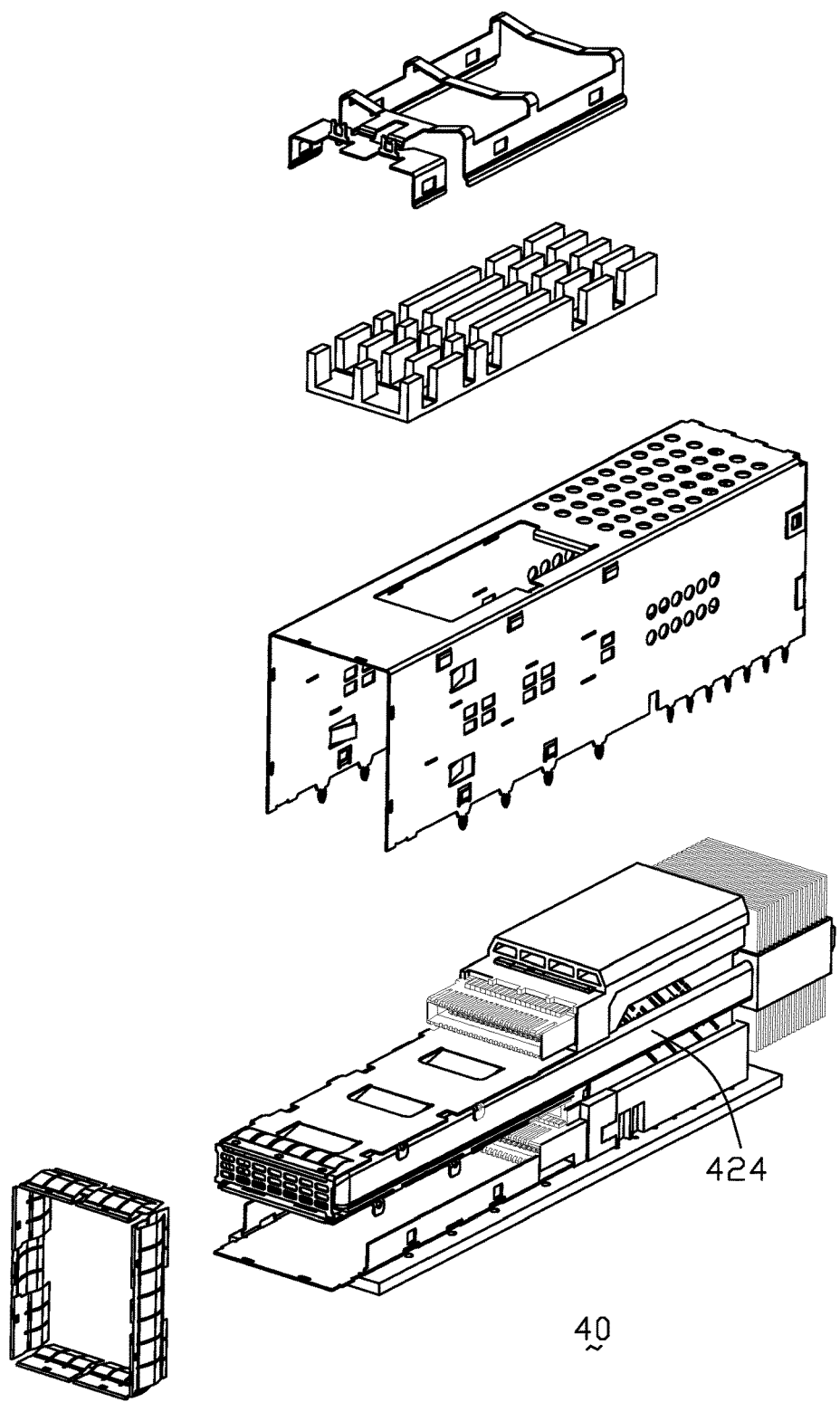
FIG. 24 is an exploded perspective view of the electrical connector assembly of FIG. 23.
Figure 25:
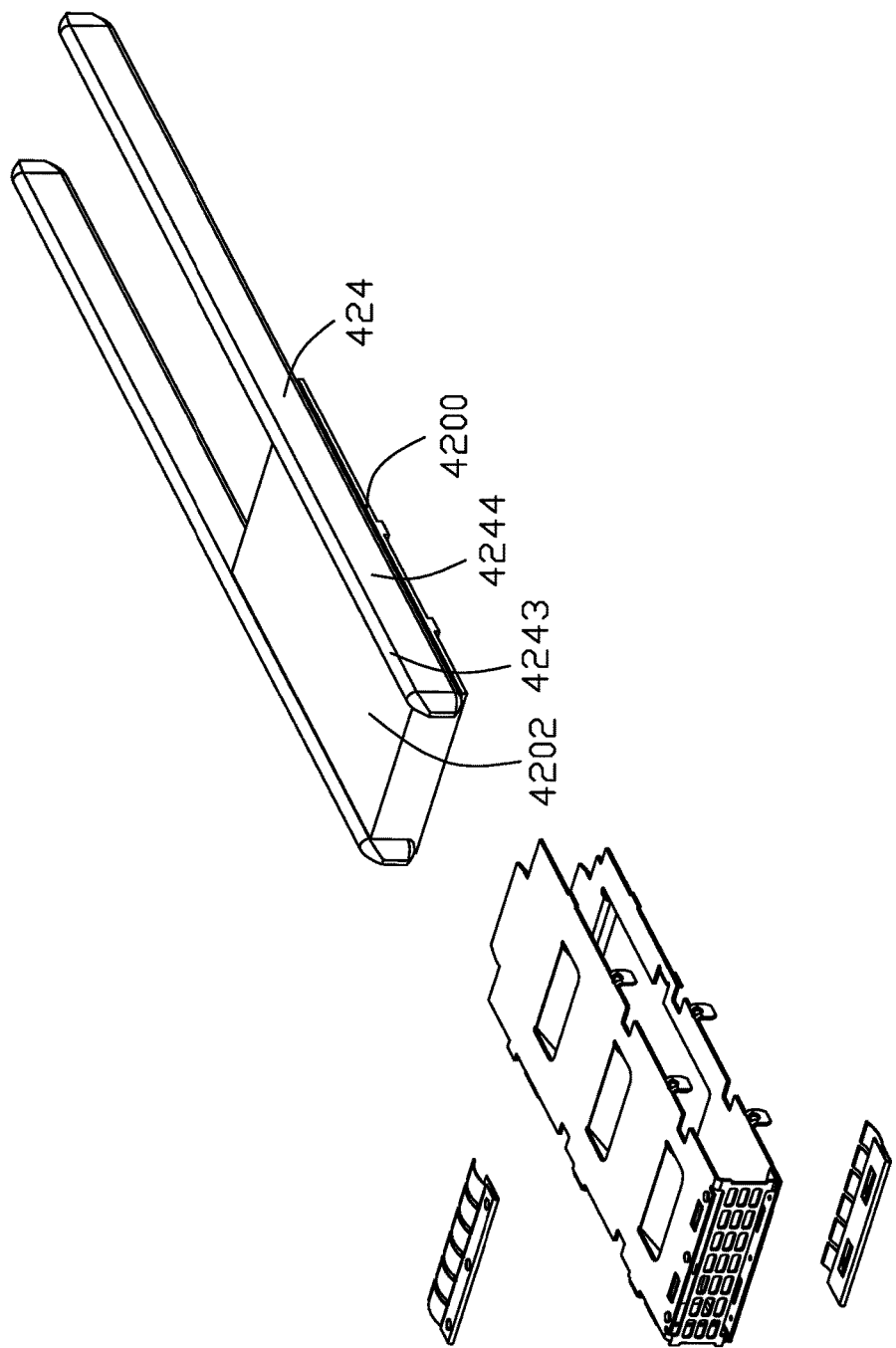
FIG. 25 is a middle heat transfer unit of the electrical connector assembly of FIG. 24.
Figure 26:
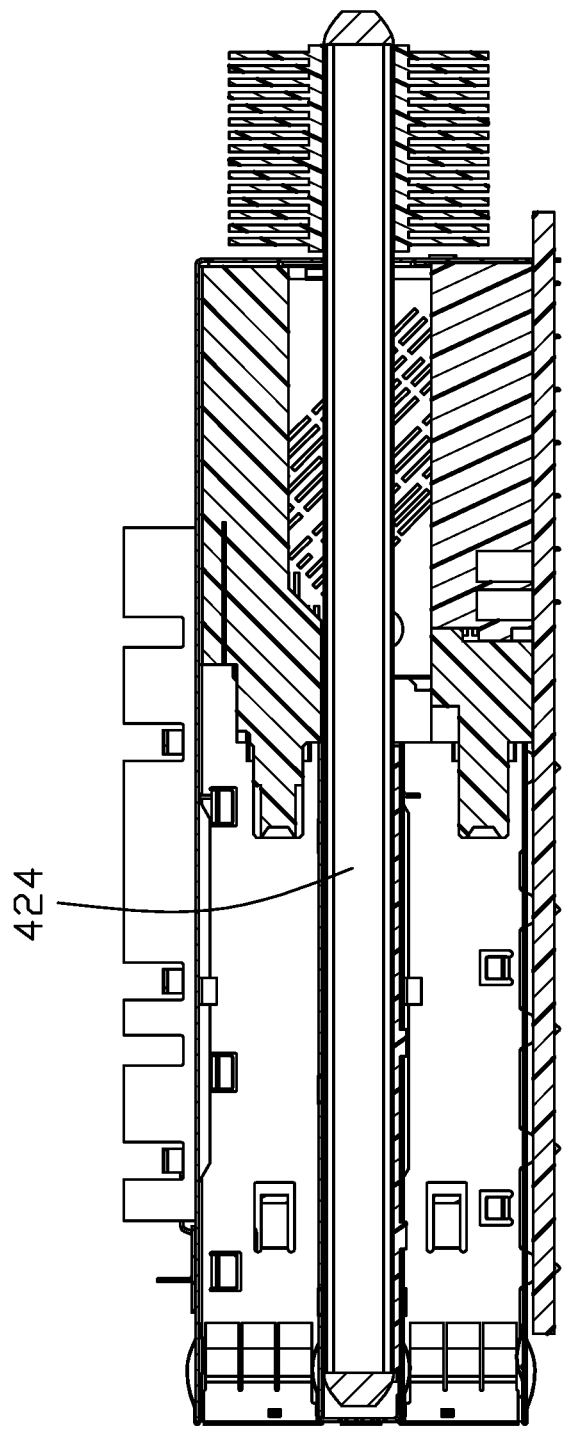
FIG. 26 is a cross-sectional view of the electrical connector assembly of FIG. 23.
Figure 27:
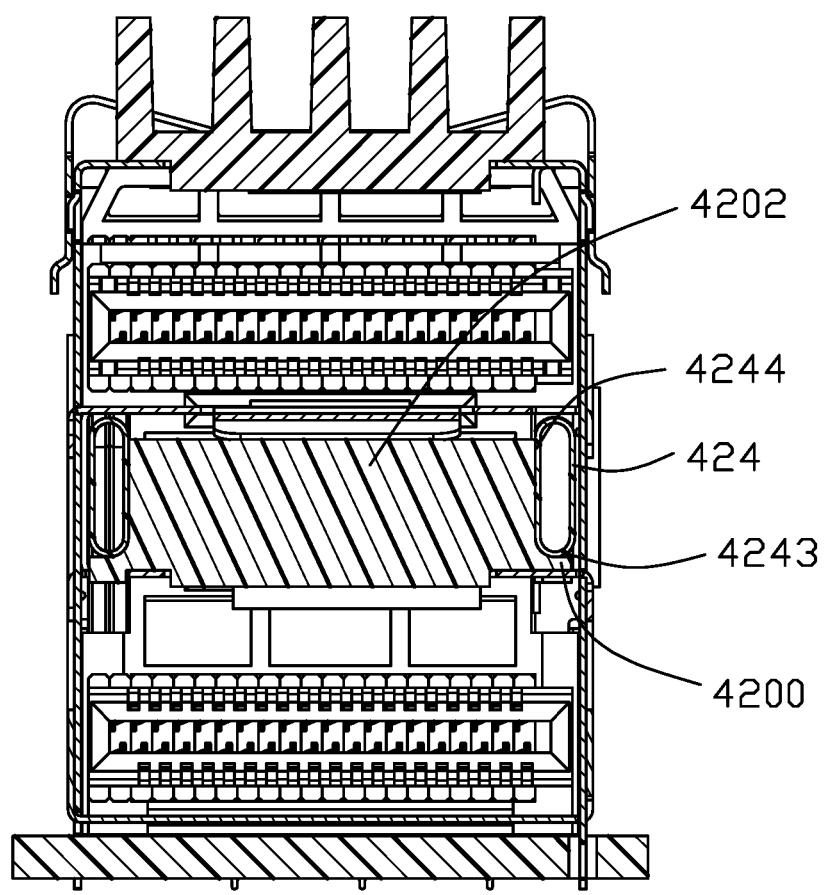
FIG. 27 is another cross-sectional view of the electrical connector assembly of FIG. 23.

The electrical connector assembly 10 comprises a middle heat transfer unit 220 received in middle receiving portion 1024 of the middle portion 102 and located between the pair of mating ports 204. The middle heat transfer unit 220 is in communication with the outer environment through the through holes 105. The middle heat transfer unit 220 includes a metallic thermally conductive base or heat base 222, and a pair of heat pipes 224 thermally connected on two lateral sides of the heat base 222. The heat base 222 can be a solid monolithic block to better transfer heat to the heat pipes 224, compared with the traditional heat sink structure having the airflow paths therein. The heat base 222 comprises a base portion 2200, a bottom projection portion 2201 projected downwardly for being thermally connected with a plug connector mated with a lower of the mating ports 24 through the bottom through hole 1023, the bottom projection portion 2201 having a size smaller than a size of the base portion 2200 so as to form a T-shaped cross-sectional configuration, viewed along the front-to-back direction. The heat base 220 comprises an upper projection portion 2202 projected upwardly. The spring tabs 1021 downwardly press against with the upper projection portion 2202. The upper projection portion 2202 has a width smaller than a width of the base portion 2200 that forms a pair of receiving areas 2203 spaced from each other between the base portion 2200 and the upper projection portion 2202 for receiving the pair of heat pipes 224, respectively so that the pair of heat pipes 224 are located by two sides of and aligned with the upper projection portion 2202 in the transverse direction. Each of the pair of heat pipes 224 is directly contacted with at least two different surfaces of the heat base 222. The heat pipes 224 extend rearward out of the rear of the metallic cage 100 to be connected to a rear heat sink unit 230 which includes a plurality of fins 231 stacked manufactured by such Aluminum, Copper or other suitable material, via a retainer clip 232, with one another along either the front-to-back direction or the transverse direction (FIG. 4). Notably, the retainer clip 232 is optionally unitarily formed with the fins 231. Understandably, the heat base 222 and the middle portion 102 may be unitarily formed as one piece by soldered.

In this embodiment, each the heat pipe 224 is of a twisted type. Each of the heat pipes 224 comprises a front portion 2240 for being thermally connected with the heat base 220, a rear portion 2241 for being thermally connected with the rear heat sink unit 230, and a transition portion 2242 connected therebetween and making the front portion 2240 orthogonal with the rear portion 2241. A distance between the front portions 2240 of the pair of the heat pipes 224 is small than a distance between the rear portions 2241 of the pair of the heat pipes 224. Each of the heat pipes 224 comprises a pair of first surfaces 2243 and a pair of second surfaces 2244 wider than the first surfaces 2243. A distance between the pair of first surface is greater than 5.25 mm, and a distance between the pair of second surface is greater than 1.5 mm. Each of the heat pipes 224 has a substantially constant cross section except the transition portion 2242. One of the first surfaces 2243 of each of the front portion 2240 of the heat pipes 224 is thermally connected with one of the at least two different surfaces formed in the upper projection portion 2202. One of the second surfaces 2244 of each of the front portion 2240 of the heat pipes 224 is thermally connected with the other of the at least two different surfaces formed in the base portion 2200. Each of the heat pipes 224 includes liquid that, when exposed to the thermal energy, changes phase to a vapor and travels toward the rear portion 2241. The hot vapor cools once it is in the cooled rear portion 2241 and condenses back into a liquid. The liquid travels back to the hot front portion 2240 and repeats the process. Each of the heat pipes 224 has about 8 W max power, and about 0.8° C./W thermal resistance.

The electrical connector assembly 10 comprises a top heat sink 240 attached upon the top wall of the metallic cage 100 via a retainer clip 242 latch with the metallic cage 100. The top heat sink 240 has a portion projected downwardly and into the upper channel 103 for being thermally connected with a plug connector mated with an upper of the mating ports 24.

Referring to FIGS. 23-29, shows the second embodiment of the electrical connector assembly 40. The different compared with the first embodiment of the electrical connector assembly 10 is each of the heat pipes 424 essentially a straight type without twisting. Each of the heat pipes 424 has a substantially constant cross section. Each of the heat pipes 424 comprises a pair of first surfaces 4243 and a pair of second surfaces 4244 wider than the first surfaces 4243. One of the first surfaces 4243 of each of the heat pipes is thermally connected with one of the at least two different surfaces formed in the base portion 4200. One of the second surfaces 4244 of each of the heat pipes is thermally connected with the other of the at least two different surfaces formed in the upper projection portion 4202.

Referring to FIGS. 30-39, the third embodiment of the electrical connector assembly 70 compared to the second embodiment of the electrical connector assembly 40 is different in that each of the heat pipes 824 is of a bent type. Each of the heat pipes 824 comprises a horizontal portion 8240 and an inclined portion 8241 extending from a rear end of the horizontal portion 8240 rearwardly and upwardly. The rear heat sink unit 830 is mounted on the inclined portion 8241 that make the rear heat sink unit 830 is higher than a top end of the metallic cage 800.

Notably, in the preferable embodiments, the heat base 222 is essentially a monolithic block rather than a heat sink which forms a plurality of passages for air passing along a specific direction. Instead, the block type heat base 222 may absorb and accumulate heat as much as possible from the bottom projection portion 2201 and transfer such heat to the rear heat sink unit 230 via the pair of heat pipes 224 which are intimately connected to two opposite lateral sides of the heat base 222. From a system viewpoint on one hand, the heat generated from the upper plug connector/module received within the upper channel 103 is dissipated to an exterior via the top heat sink unit 240 which is attached upon the cage 100 via the retainer clip 242 and forms a bottom/downward projection portion 244 extending downwardly through the corresponding opening 109 in a top wall 107 of the cage 100; on the other hand, the heat generated from the lower plug connector/module received within the lower channel 104 is dissipated to the exterior via the rear heat sink unit 230 which is thermally connected to the heat pipes 224 of the middle heat transfer unit 220 having the bottom projection portion 2201 extending downwardly through the bottom through hole 1023 to contact the lower plug connector received within the lower channel 104.

What is claimed is:

1. An electrical connector assembly comprising:
   a metallic cage defining a receiving space therein and including a middle dividing portion;
   a receptacle connector unit received in the receiving space and including a pair of mating ports spaced apart from each other in a vertical direction, and a plurality of terminal wafers stacked with one another with corresponding contacting sections exposed upon the mating ports and tail sections extending downwardly to be mounted on a printed circuit board on which the receptacle connector unit is mounted; and
   a middle heat transfer unit received in the middle dividing portion and including a heat base linked with a pair of heat pipes on two sides thereof, the pair of heat pipes extending through a rear of the cage and connected to a rear heat sink unit located behind the rear of the cage;
   wherein each of the pair of heat pipes is directly contacted with at least two different surfaces of the heat base; and
   wherein the middle dividing portion resiliently presses against the heat base.

2. The electrical connector assembly as claimed in claim 1, wherein the heat base comprises a base portion, a bottom projection portion projected downwardly for being thermally connected with a plug connector mated with a lower of the mating ports, the bottom projection portion having a size smaller than a size of the base portion.

3. The electrical connector assembly as claimed in claim 2, wherein the heat base comprises an upper projection portion projected upwardly, the upper projection portion having a width smaller than a width of the base portion that forms a pair of receiving areas between the base portion and the upper projection portion for receiving the pair of heat pipes, respectively.

4. The electrical connector assembly as claimed in claim 3, wherein each of the heat pipes comprises a front portion for being thermally connected with the heat base, a rear portion for being thermally connected with the rear heat sink unit, and a transition portion connected therebetween and making the front portion orthogonal with the rear portion.

5. The electrical connector assembly as claimed in claim 4, wherein a distance between the front portions of the pair of the heat pipes is small than a distance between the rear portions of the pair of the heat pipes.

6. The electrical connector assembly as claimed in claim 5, wherein each of the heat pipes comprises a pair of first surfaces and a pair of second surfaces wider than the first surfaces, one of the first surfaces of each of the front portion of the heat pipes thermally connected with one of the at least two different surfaces formed in the upper projection portion, one of the second surfaces of each of the front portion of the heat pipes thermally connected with the other of the at least two different surfaces formed in the base portion.

7. The electrical connector assembly as claimed in claim 3, wherein each of the heat pipes has a substantially constant cross section.

8. The electrical connector assembly as claimed in claim 7, wherein each of the heat pipes comprises a pair of first surfaces and a pair of second surfaces wider than the first surfaces, one of the first surfaces of each of the heat pipes thermally connected with one of the at least two different surfaces formed in the base portion, one of the second surfaces of each of the heat pipes thermally connected with the other of the at least two different surfaces formed in the upper projection portion.

9. The electrical connector assembly as claimed in claim 7, wherein each of the heat pipes extends along a straight line.

10. The electrical connector assembly as claimed in claim 1, further comprising a top heat sink mounted on a top of the metallic cage for being thermally connected with a plug connector mated with an upper of the mating ports.

11. The electrical connector assembly as claimed in claim 1, wherein a top wall of the middle dividing portion has a spring tab downwardly pressing against an upper portion of the heat base of the middle heat transfer unit.

12. An electrical connector assembly comprising:
    a metallic cage forming a receiving space therein and including a middle dividing portion to divide the receiving space into opposite respective upper channel and lower channel in a vertical direction, the cage forming a top wall having a through opening therein, the middle dividing portion forming a bottom through hole;

a receptacle connector received within a rear portion of the receiving space and defining a pair of upper and lower mating ports spaced from each other in said vertical direction and respectively aligned with the corresponding upper channel and lower channel in a front-to-back direction perpendicular to said vertical direction;

a middle heat transfer unit located between the upper channel and the lower channel in the vertical direction and including a monolithic base retained in the middle dividing portion, and a pair of heat pipes attached to two opposite lateral sides of the base;

a top heat sink unit attached upon the top wall of the cage and including a bottom projection portion downwardly extending through said through opening of said top wall into the upper channel; and a rear heat sink unit located behind the cage and retained to the pair of heat pipes;

wherein the monolithic base forms a bottom projection portion downwardly extending through said bottom through hole of the middle dividing portion into the lower channel; and the middle dividing portion resiliently presses against the monolithic base.

13. The electrical connector assembly as claimed in claim 12, wherein said monolithic base is configured without airflow paths therein for maximizing capacity of heat absorption thereof.

14. The electrical connector assembly as claimed in claim 12, wherein the heat pipes have upwardly extending inclined portions to lift up the rear heat sink unit to be located at a same level with the top heat sink unit for airflow consideration.

15. The electrical connector assembly as claimed in claim 12, wherein the bottom projection portion of the monolithic base is dimensioned more than one half of a main portion of the monolithic base.

16. The electrical connector assembly as claimed in claim 15, wherein the bottom projection portion of the top heat sink unit is dimension and configured to be similar to that of the monolithic base.

17. The electrical connector assembly as claimed in claim 12, wherein a top wall of the middle dividing portion has a spring tab downwardly pressing against an upper portion of the monolithic base of the middle heat transfer unit.

18. An electrical connector assembly comprising:

a metallic cage forming a receiving space therein and including a middle dividing portion to divide the receiving space into opposite respective upper channel and lower channel in a vertical direction;

a receptacle connector received within a rear portion of the receiving space and defining a pair of upper and lower mating ports spaced from each other in said vertical direction and respectively aligned with the corresponding upper channel and lower channel in a front-to-back direction perpendicular to said vertical direction;

a middle heat transfer unit located between the upper channel and the lower channel in the vertical direction and including a single metallic monolithic base retained in the middle dividing portion, and a pair of heat pipes attached to two opposite lateral sides of the base; and a rear heat sink unit located behind the cage and retained to the pair of heat pipes;

the monolithic base forms a bottom projection portion downwardly extending through a bottom through hole in the middle dividing portion into the lower channel;

wherein the bottom projection portion of the monolithic base is dimensioned more than one half of a main portion of the monolithic base; and the monolithic base forms, viewed along the front-to-back direction, a T-shaped cross-sectional configuration, and the pair of heat pipes are aligned with the monolithic base in a transverse direction perpendicular to both the vertical direction and the front-to-back direction.

19. The electrical connector assembly as claimed in claim 18, wherein a top wall of the middle dividing portion has a spring tab downwardly pressing against an upper portion of the monolithic base of the middle heat transfer unit.

20. The electrical connector assembly as claimed in claim 18, wherein said monolithic base forms a pair of opposite receiving areas located by two sides of an upper projecting portion thereof and spaced from each other to receive the pair of heat pipes, respectively.

* * * * *